(12) United States Patent
Basker et al.

(10) Patent No.: US 9,947,763 B2
(45) Date of Patent: *Apr. 17, 2018

(54) FINFET WITH REDUCED CAPACITANCE

(71) Applicant: International Business Machines Corporation, Armonk, NY (US)

(72) Inventors: Veeraraghavan S. Basker, Schenectady, NY (US); Kangguo Cheng, Schenectady, NY (US); Ali Khakifirooz, Los Altos, CA (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/076,711

(22) Filed: Mar. 22, 2016

(65) Prior Publication Data

US 2016/0204225 A1 Jul. 14, 2016

Related U.S. Application Data

(60) Continuation of application No. 14/963,277, filed on Dec. 9, 2015, now Pat. No. 9,536,979, which is a
(Continued)

(51) Int. Cl.
| | |
|---|---|
| *H01L 29/66* | (2006.01) |
| *H01L 29/78* | (2006.01) |
| *H01L 29/06* | (2006.01) |
| *H01L 21/8234* | (2006.01) |
| *H01L 21/84* | (2006.01) |

(Continued)

(52) U.S. Cl.
CPC .......... *H01L 29/66545* (2013.01); *H01L 21/823431* (2013.01); *H01L 21/845* (2013.01); *H01L 27/0886* (2013.01); *H01L 27/1211* (2013.01); *H01L 29/0649* (2013.01); *H01L 29/0847* (2013.01); *H01L 29/6681* (2013.01);
(Continued)

(58) Field of Classification Search
CPC .......... H01L 21/823431; H01L 21/845; H01L 27/0886; H01L 27/1211; H01L 29/0847; H01L 29/6681; H01L 29/785; H01L 29/66795; H01L 29/7831
USPC ............... 257/288, 368, 369, 328, 330, 347; 438/151, 197, 199, 478, 231, 257, 300
See application file for complete search history.

(56) References Cited

U.S. PATENT DOCUMENTS

| | | |
|---|---|---|
| 6,909,151 B2 | 6/2005 | Hareland et al. |
| 6,974,738 B2 | 12/2005 | Hareland et al. |

(Continued)

OTHER PUBLICATIONS

Pending U.S. Appl. No. 15/336,864, filed Oct. 28, 2016, entitled: "FinFET With Reduced Capacitance", 50 pages.
(Continued)

*Primary Examiner* — Jarrett Stark
*Assistant Examiner* — Shahed Ahmed
(74) *Attorney, Agent, or Firm* — L. Jeffrey Kelly

(57) ABSTRACT

A method including depositing a gap fill material on top of a conformal dummy gate oxide above and in between a plurality of fins, forming one or more openings between the plurality of fins and the gap fill material by selectively removing a portion of the conformal dummy gate oxide, and forming a gate within the one or more openings, and above the plurality of fins and the gap fill material.

19 Claims, 27 Drawing Sheets

Related U.S. Application Data division of application No. 14/642,937, filed on Mar. 10, 2015, now Pat. No. 9,312,275, which is a division of application No. 13/847,724, filed on Mar. 20, 2013, now Pat. No. 9,040,363.

(51) Int. Cl.
  *H01L 27/088* (2006.01)
  *H01L 27/12* (2006.01)
  *H01L 29/08* (2006.01)

(52) U.S. Cl.
  CPC .. *H01L 29/66553* (2013.01); *H01L 29/66795* (2013.01); *H01L 29/785* (2013.01)

(56) References Cited

U.S. PATENT DOCUMENTS

| | | | |
|---|---|---|---|
| 7,101,742 B2 | 9/2006 | Ko et al. |
| 7,190,050 B2 | 3/2007 | King et al. |
| 7,198,995 B2 | 4/2007 | Chidambarrao et al. |
| 7,224,033 B2 | 5/2007 | Zhu et al. |
| 7,241,653 B2 | 7/2007 | Hareland et al. |
| 7,314,802 B2 | 1/2008 | Zhu et al. |
| 7,348,284 B2 | 3/2008 | Doyle et al. |
| 7,352,034 B2 | 4/2008 | Booth, Jr. et al. |
| 7,388,259 B2 | 6/2008 | Doris et al. |
| 7,442,967 B2 | 10/2008 | Ko et al. |
| 7,470,570 B2 | 12/2008 | Beintner et al. |
| 7,525,160 B2 | 4/2009 | Kavalieros et al. |
| 7,564,081 B2 | 7/2009 | Zhu et al. |
| 7,566,364 B2 | 7/2009 | Xianyu et al. |
| 7,851,340 B2 | 12/2010 | Brownson et al. |
| 7,851,865 B2 | 12/2010 | Anderson et al. |
| 7,863,136 B2 | 1/2011 | Goldbach et al. |
| 7,879,675 B2 | 2/2011 | Radosavljevic et al. |
| 7,902,005 B2 | 3/2011 | Stapelmann et al. |
| 8,114,746 B2 | 2/2012 | Wei et al. |
| 8,134,209 B2 | 3/2012 | Yagishita et al. |
| 8,236,634 B1 | 8/2012 | Kanike et al. |
| 8,368,146 B2 | 2/2013 | Basker et al. |
| 9,040,363 B2 | 5/2015 | Basker et al. |
| 2005/0001267 A1* | 1/2005 | Miyagawa ...... H01L 21/823842 257/332 |
| 2006/0043616 A1 | 3/2006 | Anderson et al. |
| 2006/0057787 A1 | 3/2006 | Doris et al. |
| 2006/0071275 A1 | 4/2006 | Brask et al. |
| 2006/0180866 A1 | 8/2006 | Zhu et al. |
| 2007/0096206 A1 | 5/2007 | Chidambarrao |
| 2007/0122984 A1 | 5/2007 | Zhu et al. |
| 2008/0173942 A1 | 7/2008 | Zhu et al. |
| 2008/0217692 A1 | 9/2008 | Anderson et al. |
| 2008/0296632 A1 | 12/2008 | Moroz et al. |
| 2009/0238010 A1 | 9/2009 | Juengling |
| 2011/0193175 A1 | 8/2011 | Huang et al. |
| 2012/0193713 A1 | 8/2012 | Kulkarni et al. |
| 2013/0093019 A1 | 4/2013 | Ando et al. |
| 2013/0277748 A1 | 10/2013 | Lee et al. |
| 2014/0035066 A1 | 2/2014 | Tsai et al. |
| 2014/0203370 A1 | 7/2014 | Maeda et al. |
| 2014/0264489 A1 | 9/2014 | Wong et al. |
| 2014/0273359 A1 | 9/2014 | Kim et al. |
| 2015/0187816 A1 | 7/2015 | Basker et al. |

OTHER PUBLICATIONS

Pending U.S. Appl. No. 15/077,948, filed Mar. 23, 2016, entitled: "FinFET With Reduced Capacitance", 49 pages.
Pending U.S. Appl. No. 14/963,277, filed Dec. 9, 2015, entitled: "FinFET With Reduced Capacitance", 51 pages.

* cited by examiner

FINFET WITH REDUCED CAPACITANCE

BACKGROUND

The present invention generally relates to integrated circuits, and more particularly to reducing parasitic capacitance of a finFET semiconductor device.

As integrated circuits continue to scale downward in size, a fin field effect transistor (finFET) is becoming more widely used. A typical finFET device may be fabricated with either a gate first process flow or a gate last, or replacement gate, process flow. Typically, a gate first process flow may include forming fins in a substrate, depositing a gate stack including a high-k dielectric and one or more gate metals, and finally etching the final gate structures. Alternatively, a replacement gate (RG) process flow may include the use of a dummy gate stack. In both cases, a gate electrode of the final finFET structure may occupy most of the space between adjacent fins in a gate region of the finFET. Furthermore, an epitaxially grown region (EPI region) may be formed above the ends of the fins not covered by the gate, for example source-drain regions. The EPI region may effectively merge the source-drain regions of adjacent devices, and in doing so, may occupy the space between adjacent fins. Therefore, the space between adjacent fins in the source-drain regions may be occupied with EPI region, and the space between adjacent fins in a gate region may be occupied by the gate electrode. In most cases, the source-drain regions may be coupled with two opposite sides of the gate region, with a spacer to electrically insulate the gate region from the source-drain regions.

The configuration of the EPI region and the gate electrode separated by the spacer may unintentionally form a capacitive structure in which two electrical conductors are separated by an insulator. This configuration may result in undesirable parasitic capacitance which may typically be referred to as gate-to-EPI capacitance. The gate-to-EPI capacitance may add to the total capacitance associated with the device and reduce the switching speed of the device.

Therefore, it may be desirable, among other things, to reduce the gate-to-EPI capacitance.

SUMMARY

According to one embodiment of the present invention, a method is provided. The method may include depositing a gap fill material on top of a conformal dummy gate oxide above and in between a plurality of fins, forming one or more openings between the plurality of fins and the gap fill material by selectively removing a portion of the conformal dummy gate oxide, and forming a gate within the one or more openings, and above the plurality of fins and the gap fill material.

According to another exemplary embodiment, a method is provided. The method may include depositing a gap fill material directly on top of a conformal dummy gate oxide above and in between fins such that a portion of the conformal dummy gate oxide immediately above the fins remains exposed, depositing a dummy gate directly on top of the conformal dummy gate oxide and directly on top of the gap fill material, and patterning the dummy gate, the gap fill material, and the conformal dummy gate oxide into dummy gate lines oriented perpendicular to the fins, a portion of the fins not covered by the dummy gate lines are exposed, and a portion of the gap fill material remains covered by the dummy gate. The method may further include forming spacers directly on opposite sidewalls of the dummy gate lines, including on sidewalls of the dummy gate, sidewalls of the gap fill material and sidewalls of the conformal dummy gate oxide, removing the dummy gate from between the spacers exposing the conformal dummy gate oxide and the gap fill material, forming one or more openings between the fins and the gap fill material by selectively removing a portion of the conformal dummy gate oxide, another portion of the conformal dummy gate oxide remaining directly beneath the gap fill material, and forming a gate within the one or more openings, the gate is in direct contact with both the fins and the gap fill material.

According to another exemplary embodiment, a method is provided. The method may include depositing a gap fill material directly on top of a conformal dummy gate oxide above and in between fins such that a portion of the conformal dummy gate oxide immediately above the fins remains exposed, depositing a dummy gate directly on top of the conformal dummy gate oxide and directly on top of the gap fill material, patterning the dummy gate into dummy gate lines oriented perpendicular to the fins, the dummy gate is patterned selective to the gap fill material and the conformal dummy gate oxide, and forming spacers directly on opposite sidewalls of the dummy gate lines, including sidewalls of the dummy gate and excluding sidewalls of the gap fill material and sidewalls of the conformal dummy gate oxide. The method may further include forming a first opening in a source drain region by selectively removing a portion of the conformal dummy gate oxide remaining uncovered by the dummy gate lines, the first opening is between the fins and the gap fill material in the source drain region, removing the dummy gate from between the spacers exposing the conformal dummy gate oxide and the gap fill material in a gate region, forming a second opening in the gate region by selectively removing another portion of the conformal dummy gate oxide uncovered by the dummy gate lines, the second opening is between the fins and the gap fill material in the gate region, and forming a gate within the second opening, the gate is in direct contact with both the fins and the gap fill material in the gate region.

BRIEF DESCRIPTION OF THE DRAWINGS

The following detailed description, given by way of example and not intended to limit the invention solely thereto, will best be appreciated in conjunction with the accompanying drawings, in which:

FIG. 3 illustrates the formation of a plurality of fins formed from a semiconductor substrate according to an exemplary embodiment.

FIG. 4 illustrates the formation of a dummy gate oxide and a gap fill material according to an exemplary embodiment.

FIG. 5 is a cross section view, section A-A, of FIG. 4.

FIG. 6 illustrates the formation of a plurality of dummy gate lines according to an exemplary embodiment.

FIG. 7 is a cross section view, section A-A, of FIG. 6.

FIG. 8 illustrates the formation of spacers on the sidewalls of the plurality of dummy gate lines according to an exemplary embodiment.

FIG. 9 is a cross section view, section A-A, of FIG. 8.

FIG. 10 illustrates the formation of an epitaxially grown region ("EPI region") according to an exemplary embodiment.

FIG. 11 is a cross section view, section A-A, of FIG. 10.

FIG. 12 illustrates the formation of a dielectric layer above the EPI region according to an exemplary embodiment.

FIG. 13 is a cross section view, section A-A, of FIG. 12.

FIG. 14 illustrates the selective removal of a dummy gate according to an exemplary embodiment.

FIG. 15 is a cross section view, section A-A, of FIG. 14.

FIG. 16 illustrates the selective removal of the dummy gate oxide according to an exemplary embodiment.

FIG. 17 is a cross section view, section A-A, of FIG. 16.

FIG. 18 illustrates the formation of a gate electrode according to an exemplary embodiment.

FIG. 19 is a cross section view, section A-A, of FIG. 18.

FIG. 20 illustrates the formation of a plurality of dummy gate lines according to an exemplary embodiment.

FIG. 21 is a cross section view, section A-A, of FIG. 20.

FIG. 22 illustrates the selective removal of the dummy gate oxide according to an exemplary embodiment.

FIG. 23 is a cross section view, section A-A, of FIG. 22.

FIG. 24 illustrates the formation of an EPI region according to an exemplary embodiment.

FIG. 25 is a cross section view, section A-A, of FIG. 24.

FIG. 26 illustrates the formation of a dielectric layer according to an exemplary embodiment.

FIG. 27 is a cross section view, section A-A, of FIG. 26.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The present embodiment relates generally to the fabrication of finFET devices, and more particularly, to reducing the parasitic capacitance between a gate electrode and an epitaxially grown region (hereinafter "EPI region"). The gate electrode and the EPI region may be separated by a dielectric spacer and together may form the basic structure of a capacitor. It may be advantageous to minimize the parasitic capacitance between the gate electrode and the EPI region of a finFET device to reduce the total capacitance and improve switching speed.

A finFET device may generally include a plurality of fins formed in a wafer, a gate covering a portion of the fins, where the portion of the fins covered by the gate serves as a channel region of the device and portions of the fins extending out from under the gate serve as source and drain regions of the device; and dielectric spacers on opposite sides of the gate that separate the gate from the source and drain regions. The present embodiment may be implemented in a gate last fabrication process flow, and as such a gate last, or replacement gate (RG), process flow will be relied upon for the detailed description below.

In a typical RG process flow, a semiconductor substrate may be patterned and etched to form fins. Either a bulk substrate or a semiconductor-on-insulator (SOI) substrate may be used. Next, a dummy gate may be formed in a direction perpendicular to the length of the fins. For example, the dummy gate may be pattered and etched from a blanket layer of polysilicon. A pair of spacers can be disposed on opposite sidewalls of the dummy gate. Later, the dummy gate may be removed from between the pair of spacers, as by, for example, an anisotropic vertical etch process such as a reactive ion etch (RIE). This creates an opening between the spacers where a high-k dielectric and gate electrode may then be formed.

Figure 1:
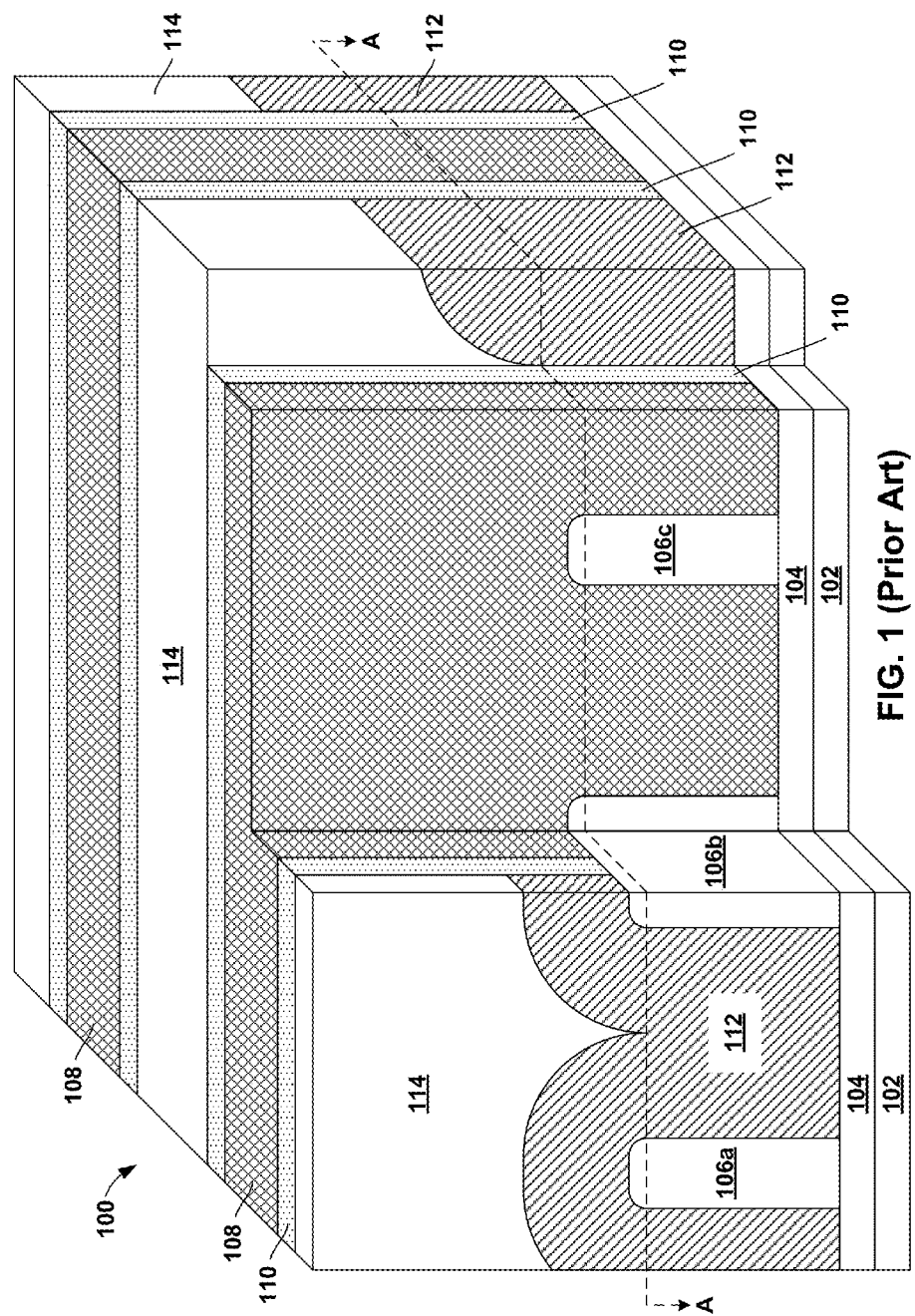
FIG. 1 is an isometric view of a finFET structure according to the prior art.
Figure 2:
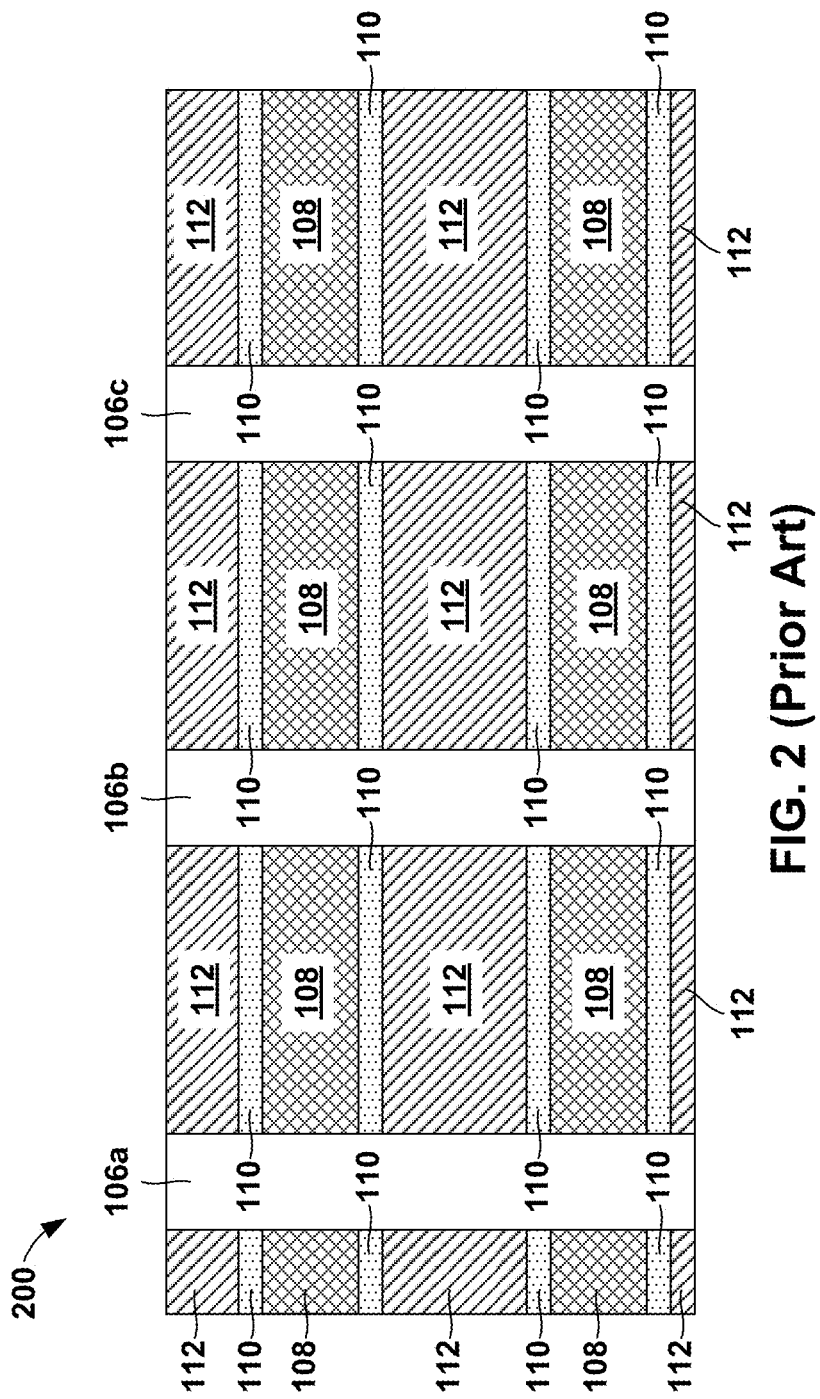
FIG. 2 is a cross section view, section A-A, of FIG. 1.

By way of example FIGS. 1 and 2 illustrate a structure 100 of a finFET. It should be noted that FIG. 1 represents an isometric view having multiple cut-out sections intended to improve clarity and understanding. While FIG. 2 is a cross-section view, section A-A, of FIG. 1. It should be noted, that the section A-A is a view of the structure 100 below a top surface of the fins 106a-106c.

Referring now to FIG. 1, the isometric view of the structure 100 is shown at an intermediate step during the process flow. At this step of fabrication, the structure 100 may generally include the plurality of fins 106a-106c, etched from a semiconductor substrate. The semiconductor substrate may include a bulk semiconductor or a layered semiconductor such as Si/SiGe, a silicon-on-insulator (SOI), or a SiGe-on-insulator (SGOI). Bulk semiconductor substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. In the embodiment shown in FIG. 1 a SOI substrate may be used. The SOI substrate may include a base substrate 102, a buried dielectric layer 104 formed on top of the base substrate 102, and a SOI layer (not shown) formed on top of the buried dielectric layer 104. The buried dielectric layer 104 may isolate the SOI layer from the base substrate 102. It should be noted that the plurality of fins 106a-106c may be etched from the uppermost layer of the SOI substrate, the SOI layer.

The base substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 102 may be about, but is not limited to, several hundred microns thick. For example, the base substrate 102 may have a thickness ranging from 0.5 mm to about 1.5 mm.

The buried dielectric layer 104 may include any of several dielectric materials, for example, oxides, nitrides and oxynitrides of silicon. The buried dielectric layer 104 may also include oxides, nitrides and oxynitrides of elements other than silicon. In addition, the buried dielectric layer 104 may include crystalline or non-crystalline dielectric material. Moreover, the buried dielectric layer 104 may be formed using any of several known methods, for example, thermal or plasma oxidation or nitridation methods, chemical vapor deposition methods, and physical vapor deposition methods. The buried dielectric layer 104 may have a thickness ranging from about 5 nm to about 200 nm. In one embodiment, the buried dielectric layer 104 may have a thickness ranging from about 150 nm to about 180 nm.

The SOI layer may include any of the several semiconductor materials included in the base substrate 102. In general, the base substrate 102 and the SOI layer may include either identical or different semiconducting materials with respect to chemical composition, dopant concentration and crystallographic orientation. In one particular embodiment of the present invention, the base substrate 102 and the SOI layer include semiconducting materials that include at least different crystallographic orientations. Typically the base substrate 102 or the SOI layer include a {110} crystallographic orientation and the other of the base substrate 102 or the SOI layer includes a {100} crystallographic orientation. Typically, the SOI layer may include a thickness ranging from about 5 nm to about 100 nm. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that the plurality of fins 106a-106c may be etched from the SOI layer. Because the plurality of fins 106a-106c may be etched from the SOI layer, they too may share any of the characteristics listed above for the SOI layer.

With continued reference to FIG. 1 and now referring also to FIG. 2, the structure 100 may include multiple gate electrodes, for example a gate electrode 108, formed on top of, and perpendicular to, the fins 106a-106c. The gate electrode 108 may further include one or more dielectric spacers, for example spacers 110. The spacers 110 may be formed by conformally depositing or growing a dielectric, followed by an anisotropic etch that removes the dielectric from the horizontal surfaces of the structure 100 and from vertical sidewalls of the fins 106a-106c, while leaving it on the sidewalls of the gate electrode 108. In a RG process flow, the spacers 110 may remain on the sidewalls of a dummy gate (not shown). In one embodiment, the spacers 110 may include any suitable dielectric material such as silicon nitride. In one embodiment, the spacers 110 may have a horizontal width, or thickness, ranging from about 3 nm to about 30 nm. The spacers 110 may include a single layer; however, the spacers 110 may include multiple layers of dielectric material. The spacers 110 may be positioned along the sidewalls of the gate electrode 108 and separate the gate electrode 108 from an epitaxially merged source-drain region, for example an EPI region 112. A dielectric layer 114 may fill any remaining space above the EPI region 112 and between the spacers 110.

The configuration of the gate electrode 108 and the EPI region 112 separated by the spacer 110 may experience capacitive characteristics. (See FIG. 2). The spacer 110 may typically include a nitride, or other material having a moderately high dielectric constant, and therefore result in undesirable parasitic capacitance within the structure 100. The parasitic capacitance may lower the switching speed of the transistor. It may therefore be desirable to reduce or eliminate the parasitic capacitance described above.

Ideally, parasitic capacitance between any gate electrode and EPI region may preferably be reduced or eliminated for the reasons discussed above. One way to reduce the parasitic capacitance between a gate electrode and an EPI region may include reducing the amount of gate electrode material in close proximity to the EPI region. One exemplary embodiment by which to reduce the parasitic capacitance is described in detail below by referring to the accompanying drawings in FIGS. 3-20. In the present embodiment, a gap fill material may be incorporated into a typical RG process flow to effectively reduce the amount of gate electrode material in close proximity to the EPI region.

Referring now to FIGS. 3-19, exemplary process steps of forming a structure 200 in accordance with one embodiment of the present invention are shown, and will now be described in greater detail below. It should be noted that FIGS. 3-19 all depict the structure 200 having a plurality of fins 206a-206c formed in a semiconductor substrate. Furthermore, it should be noted that while this description may refer to some components of the structure 200 in the singular tense, more than one component may be depicted throughout the figures and like components are labeled with like numerals. The specific number of fins depicted in the figures is for illustrative purposes only.

Figure 3:
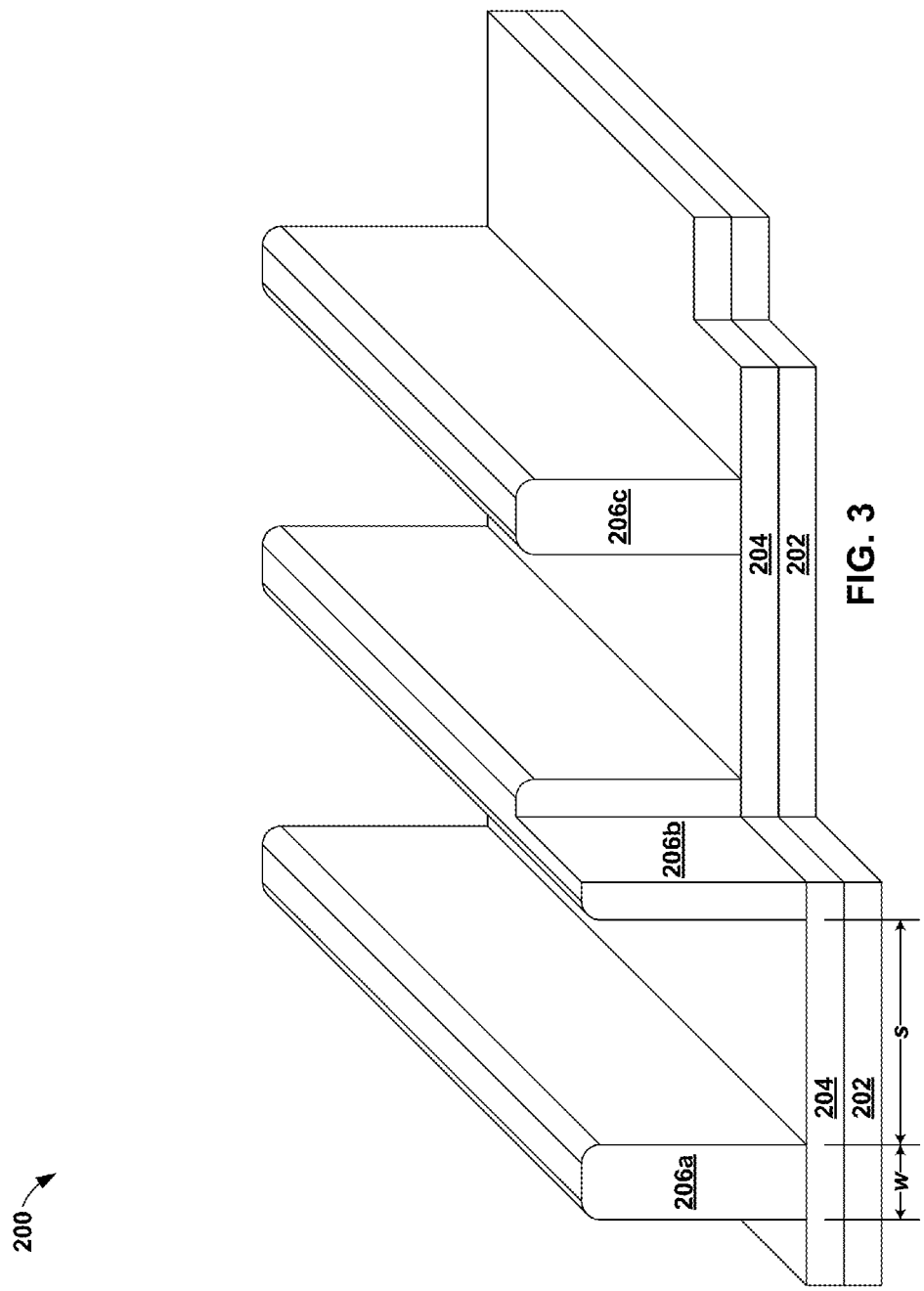
FIGS. 3-19 illustrate the steps of a method of forming a finFET according to an exemplary embodiment.

Referring now to FIG. 3, an isometric view of the structure 200 is shown at an intermediate step during the process flow. At this step of fabrication, the structure 200 may generally include the plurality of fins 206a-206c, etched from a substrate. Like above, the semiconductor substrate may include a bulk semiconductor or a layered semiconductor such as Si/SiGe, a silicon-on-insulator (SOI), or a SiGe-on-insulator (SGOI). In the present embodiment, a SOI substrate may be used. The SOI substrate may include a base substrate 202, a buried dielectric layer 204 formed on top of the base substrate 202, and a SOI layer (not shown) formed on top of the buried dielectric layer 204. The buried dielectric layer 204 may isolate the SOI layer from the base substrate 202. It should be noted that the plurality of fins 206a-206c may be etched from the uppermost layer of the SOI substrate, the SOI layer. The base substrate 202 and the buried dielectric layer 204 may be substantially similar to the base substrate 102 and the buried dielectric layer 104, described above. Furthermore, the SOI layer, for example the plurality of fins 206a-206c, may be substantially similar to the SOI layer and the plurality of fins 106a-106c, described above. The fins 206a-206c may have a width (w) and be spaced by a distance (s), as shown in the figure. In one embodiment, the width (w) of the fins 206a-206c may be about 10 nm and the fins 206a-206c may be spaced by a distance (s) of about 30 nm to about 50 nm, as measured from the edge of one fin to the edge of another fin.

Figure 4:
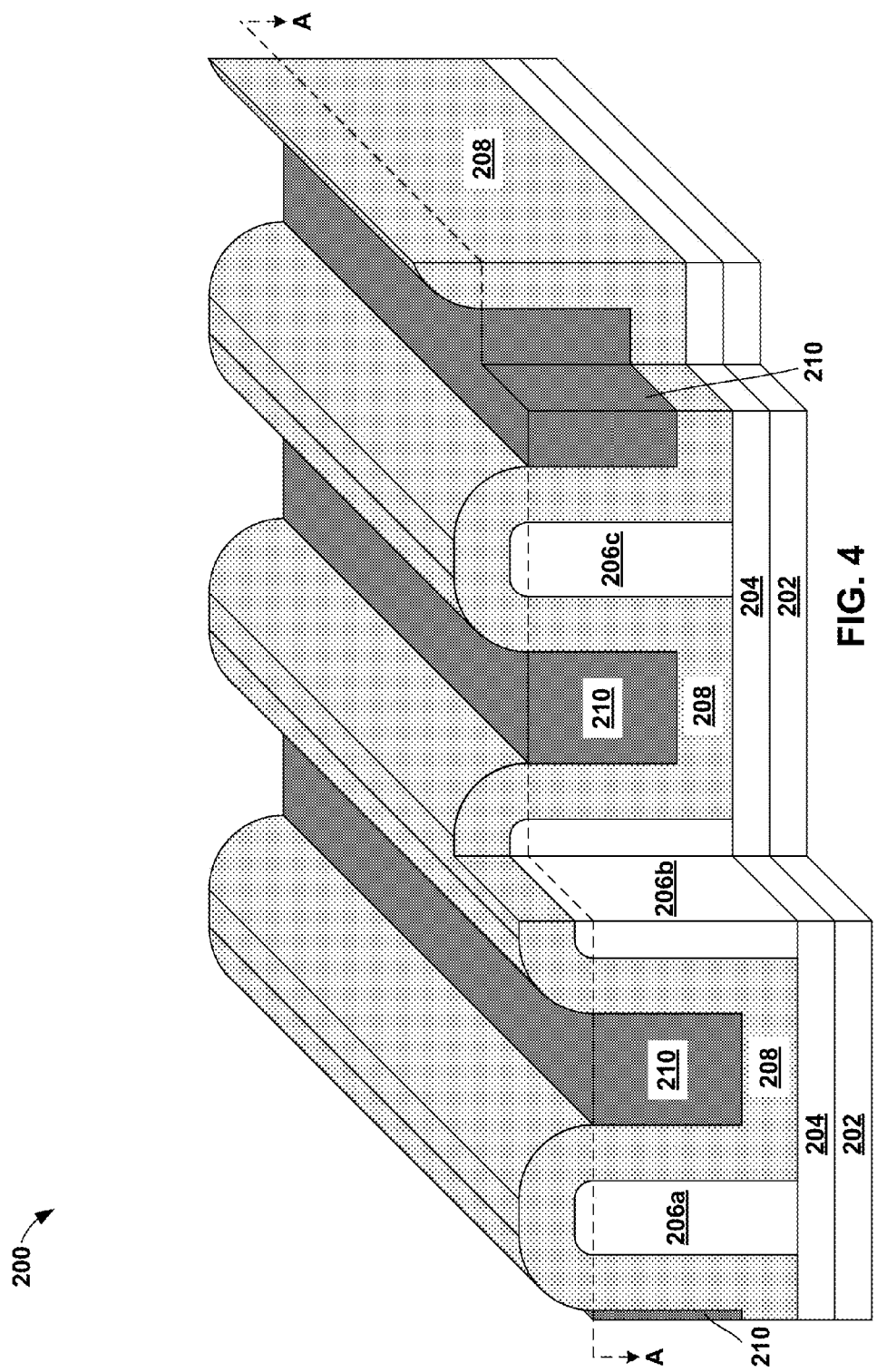

Referring now to FIG. 4, the isometric view of the structure 200 is shown after the deposition of a dummy gate oxide 208 and a gap fill material 210. The dummy gate oxide 208 may include any suitable oxide, for example, a silicon oxide or a silicon oxynitride. In a preferred embodiment, the dummy gate oxide 208 may include any material that which may be removed selective to the gap fill material 210. The dummy gate oxide 208 can be deposited using any suitable conformal deposition technique known in the art. In one embodiment, the dummy gate oxide 208 may include silicon dioxide ($SiO_2$) deposited using a chemical vapor deposition technique. The dummy gate oxide 208 may have a thickness less than about half of the spacing (s) (FIG. 3) between two adjacent fins, for example the fins 206a-206c. In one embodiment, the dummy gate oxide 208 may have a thickness ranging from about 5 nm to about 10 nm, although a thickness less than 5 nm and greater than 10 nm may be acceptable.

The gap fill material 210 may include any suitable nitride, for example, a silicon nitride. In a preferred embodiment, the gap fill material 210 may include any material that which may have a considerably slower etch rate than the dummy gate oxide 208 described above. The gap fill material 210 can be deposited using any suitable deposition technique known in the art. In one embodiment, the gap fill material 210 may include silicon nitride ($Si_3N_4$) deposited using a chemical vapor deposition technique. In one embodiment, the gap fill material 210 may be deposited with a conformal deposition technique such as chemical vapor deposition (CVD) or plasma enhanced CVD (PECVD) and polished using for example chemical mechanical polishing (CMP) to a height determined by the dummy gate oxide 208 above the fins 206a-206c. In one embodiment, the gap fill material 210 may be subsequently etched back to the desired height with a reactive ion etching (RIE) technique. In another embodiment, the gap fill material 210 can be deposited with a deposition technique that may form a thicker material at the bottom of the opening formed between the dummy gate oxide 208 for example using a high-density plasma (HDP) CVD method. A top surface of the gap fill material 210 may be substantially flush with a top surface of the fins 206a-206c, although a height above or below the top surface of the fins 206a-206c may be acceptable.

Figure 5:
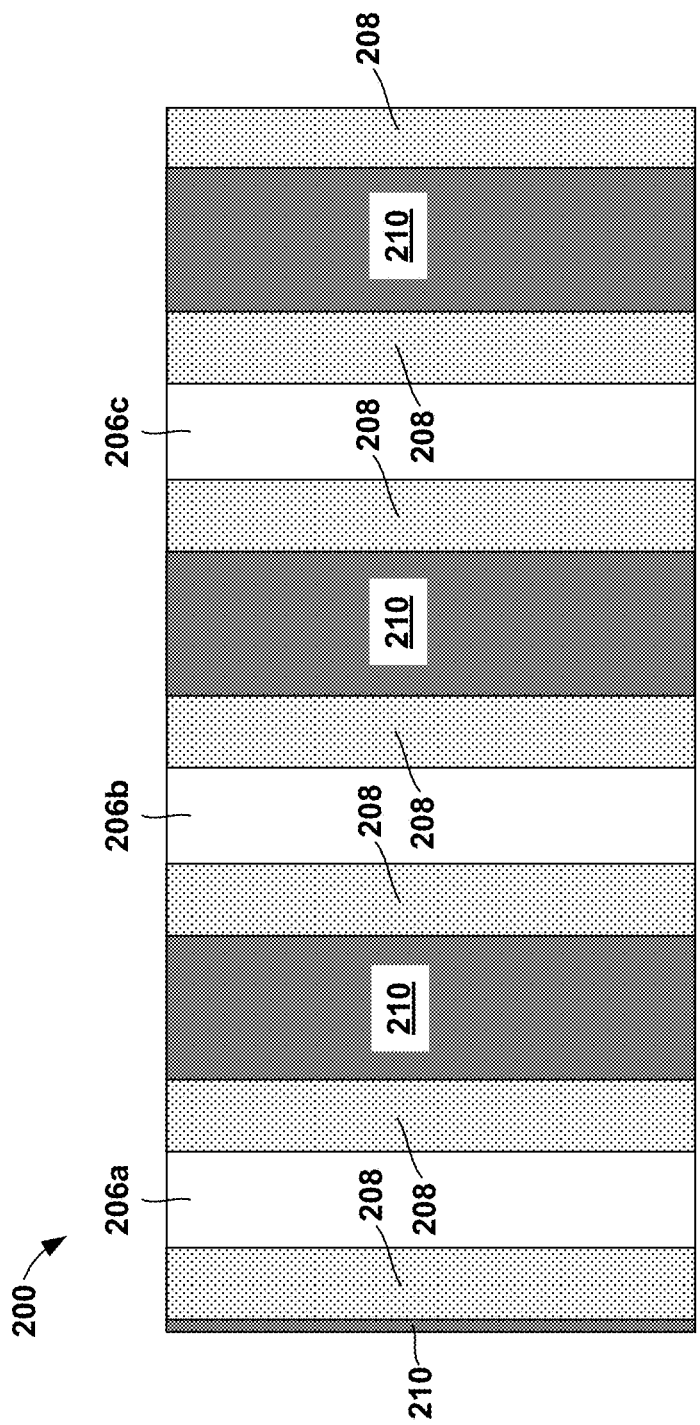

Referring now to FIG. 5, a cross section view, section A-A, of FIG. 4 is shown. Again, it should be noted, that the section A-A is a view of the structure 200 below the top surface of the fins 206a-206c. The space between adjacent fins, for example the fin 206a and the fin 206b, may be filled with the dummy gate oxide 208 and the gap fill material 210. Where the fins 206a-206c may be in direct contact with only the dummy gate oxide 208, and the gap fill material 210 may be in direct contact with the dummy gate oxide 208.

Figure 6:
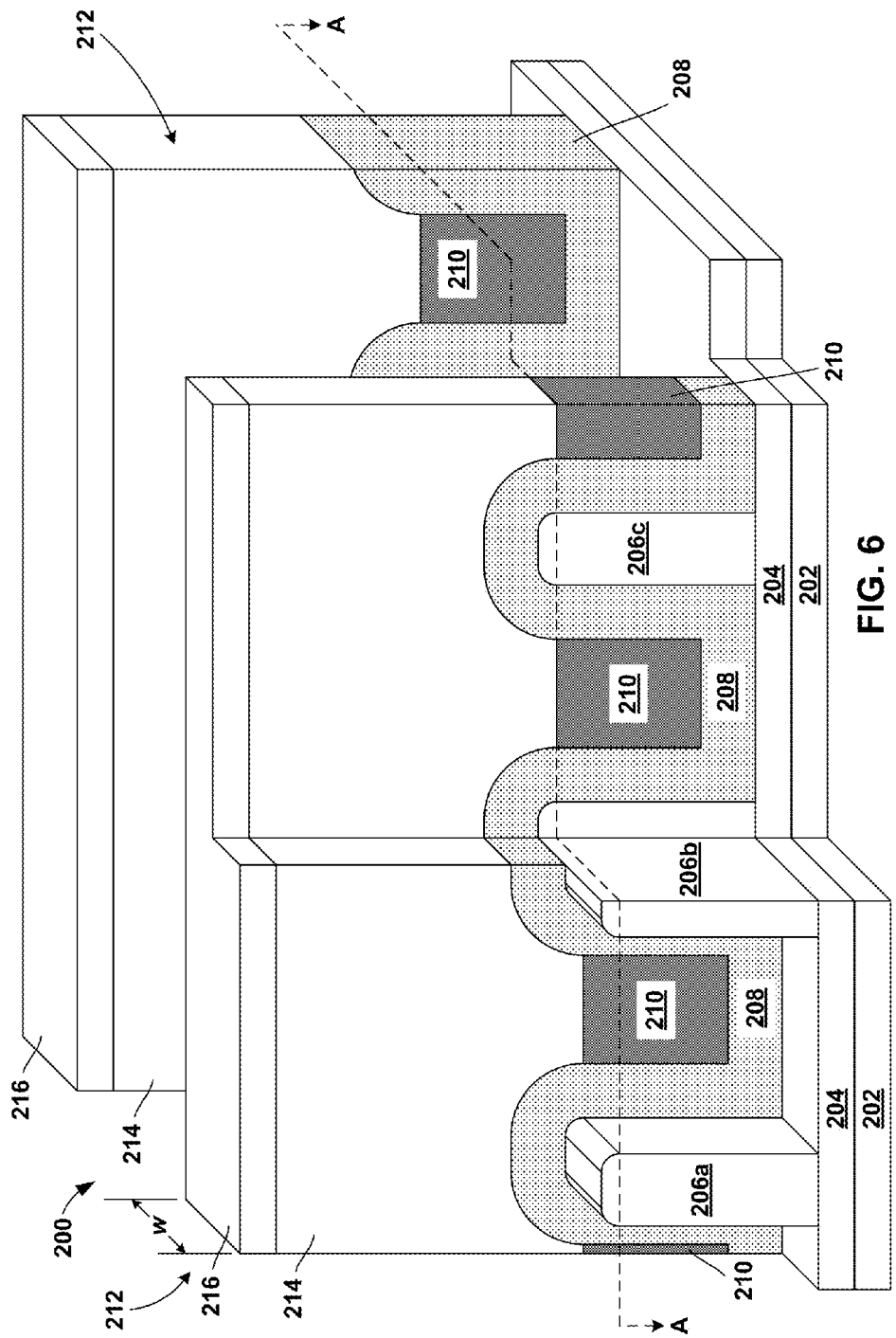

Referring now to FIG. 6, the isometric view of the structure 200 is shown after the formation of multiple dummy gate lines 212. The dummy gate lines 212 may be formed by depositing a dummy gate 214 followed by a dummy gate cap 216. The dummy gate 214 may include any suitable silicon or polysilicon able to be selectively removed. In one embodiment, the dummy gate 214 may include amorphous silicon. The dummy gate 214 may be deposited using typical deposition techniques, for example, atomic layer deposition (ALD), molecular layer deposition (MLD), chemical vapor deposition (CVD), physical vapor deposition (PVD), and spin on techniques. In one embodiment, the dummy gate 214 may have a thickness, or height, above the dummy gate oxide 208 ranging from about 30 nm to about 100 nm, and ranges there between.

The dummy gate cap 216 may include any suitable dielectric material known in the art, for example, a nitride. The dummy gate cap 216 may also be deposited using typical deposition techniques, for example, atomic layer deposition (ALD), molecular layer deposition (MLD), chemical vapor deposition (CVD), physical vapor deposition (PVD), and spin on techniques. In one embodiment, the dummy gate cap 216 may include silicon nitride ($Si_3N_4$) deposited using a chemical vapor deposition technique. In one embodiment, the dummy gate cap 216 may have a thickness ranging from about 10 nm to about 50 nm and ranges there between, although a thickness less than 10 nm and greater than 50 nm may be acceptable.

The dummy gate 214 and the dummy gate cap 216 may then be patterned into the dummy gate lines 212 by any suitable lithography technique known in the art. In one embodiment, the dummy gate lines 212 may have a width (w), as measured in a direction parallel with the fins 206a-206c. The width (w) may range from about 20 nm to about 200 nm, although lesser or greater values can be used. The presence of the gap fill material 210 may advantageously facilitate the patterning of the dummy gate lines 212 because the dummy gate oxide 208 and the gap fill material 210 produce lower variations in height as compared to a structure without the gap fill material 210. In the present embodiment, some of the dummy gate oxide 208 and some of the gap fill material 210 may preferably be removed during the patterning of the dummy gate lines 212, and thereby expose portions of the fins 206a-206c. It should be noted that the area of the structure 200 covered by the dummy gate lines 212 may generally be referred to as a gate region, and the areas of the structure 200 not covered by the dummy gate lines 212 may generally be referred to as a source-drain region.

Figure 7:
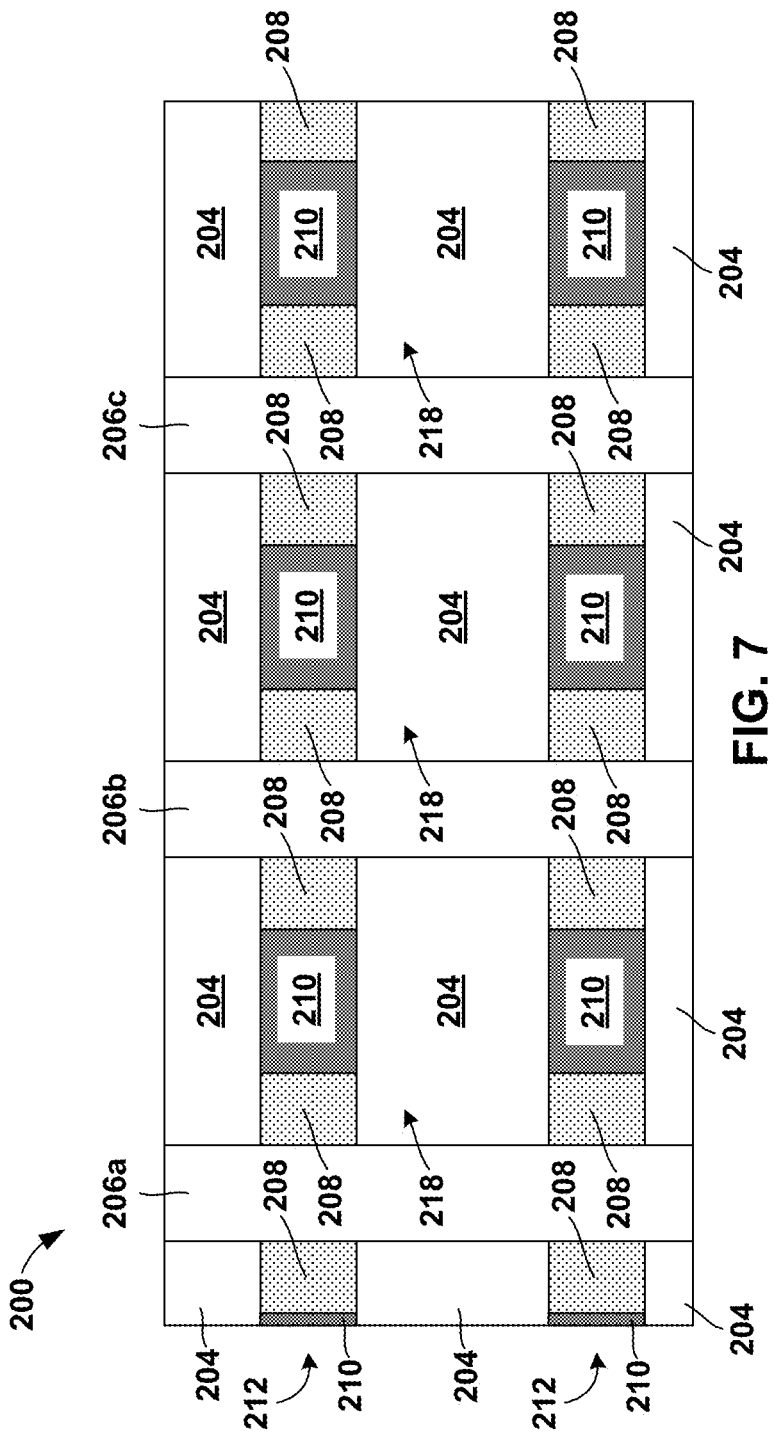

Referring now to FIG. 7, a cross section view, section A-A, of FIG. 6 is shown. The technique used to pattern the dummy gate lines 212 and remove portions of the dummy gate oxide 208 and the gap fill material 210 may further expose the buried dielectric layer 204 and form a pocket 218 in the source-drain regions of the structure 200. The pocket 218 may have two opposite sides defined by two adjacent fins and the other two opposite sides defined by two adjacent dummy gate lines 212.

Figure 8:
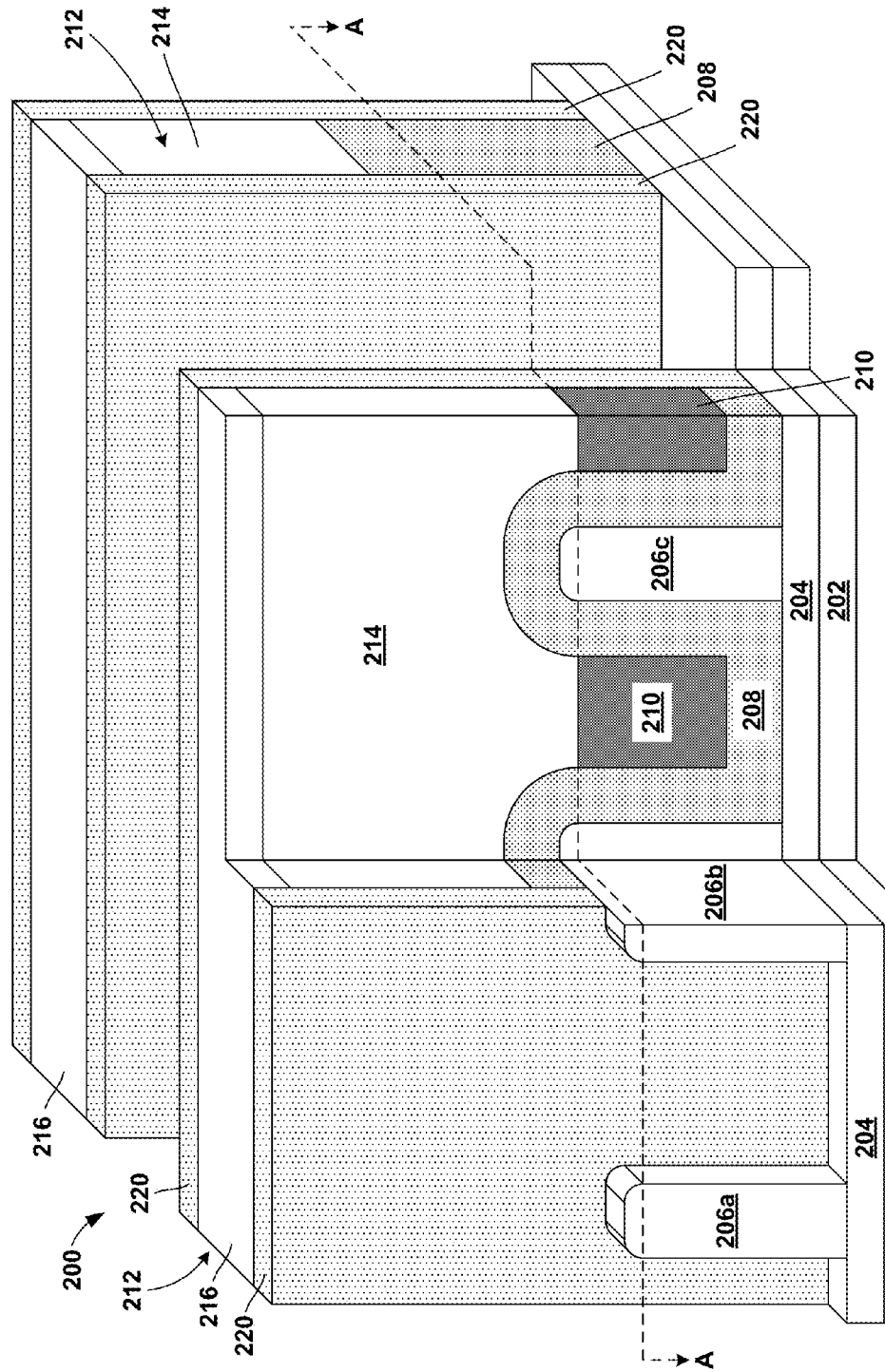

Referring now to FIG. 8, the isometric view of the structure 200 is shown after one or more spacers 220 are formed on the sidewalls the dummy gate lines 212. The spacers 220 may be formed by conformally depositing or growing a dielectric material, followed by an anisotropic etch that removes the dielectric from the horizontal surfaces of the structure 200 as well as the sidewalls of the fins 206a-206c while leaving it on the sidewalls of the dummy gate lines 212. In one embodiment, the spacers 220 may include any suitable dielectric. In one embodiment, the spacers 220 may include silicon nitride. In one embodiment, the spacers 220 may have a horizontal width, or thickness, ranging from about 3 nm to about 30 nm, with 10 nm being most typical. In one embodiment, the spacers 220 may include a similar material as the dummy gate cap 216. Typically, the spacers 220 may include a single layer; however, the spacers 220 may include multiple layers of dielectric material. It may be noted that the spacers 220 may generally insulate the gate regions from the source-drain regions.

Figure 9:
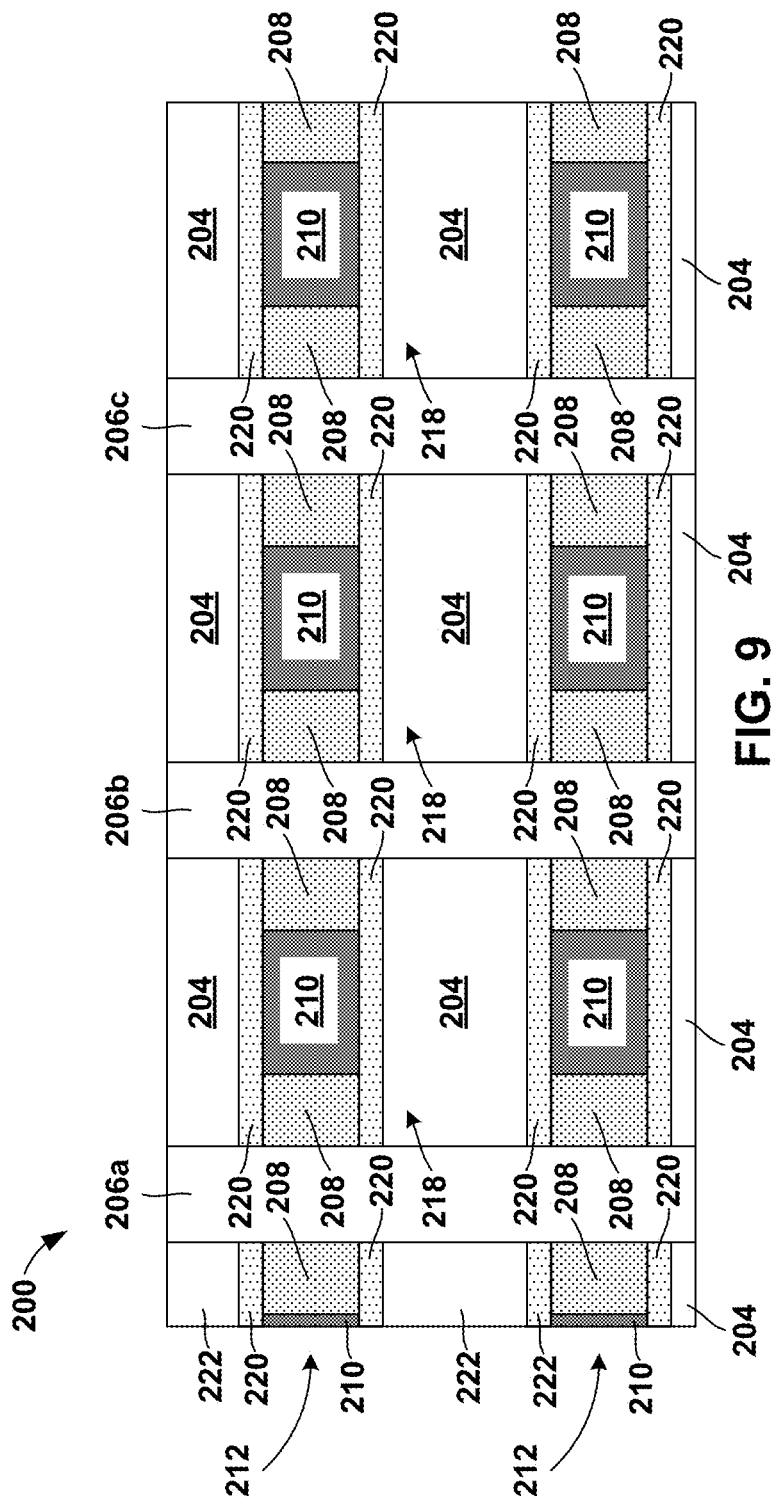

Referring now to FIG. 9, a cross section view, section A-A, of FIG. 8 is shown. The spacers 220 formed on the sidewalls of the dummy gate lines 212 may redefine the boundaries of the pocket 218. The pocket 218 may now have two opposite sides defined by two adjacent fins 206a-206c and the other two opposite sides defined by two adjacent spacers 220. It may be noted that below the top surface of the fins 206a-206c, the dummy gate lines 212 may include the dummy gate oxide 208 and the gap fill material 210. Therefore, in the gate regions, the fins 206a-206c may be separated by the dummy gate oxide 208 and the gap fill material 210. During the current step, nothing may separate the fins 206a-206c from one another in the source-drain regions.

Figure 10:
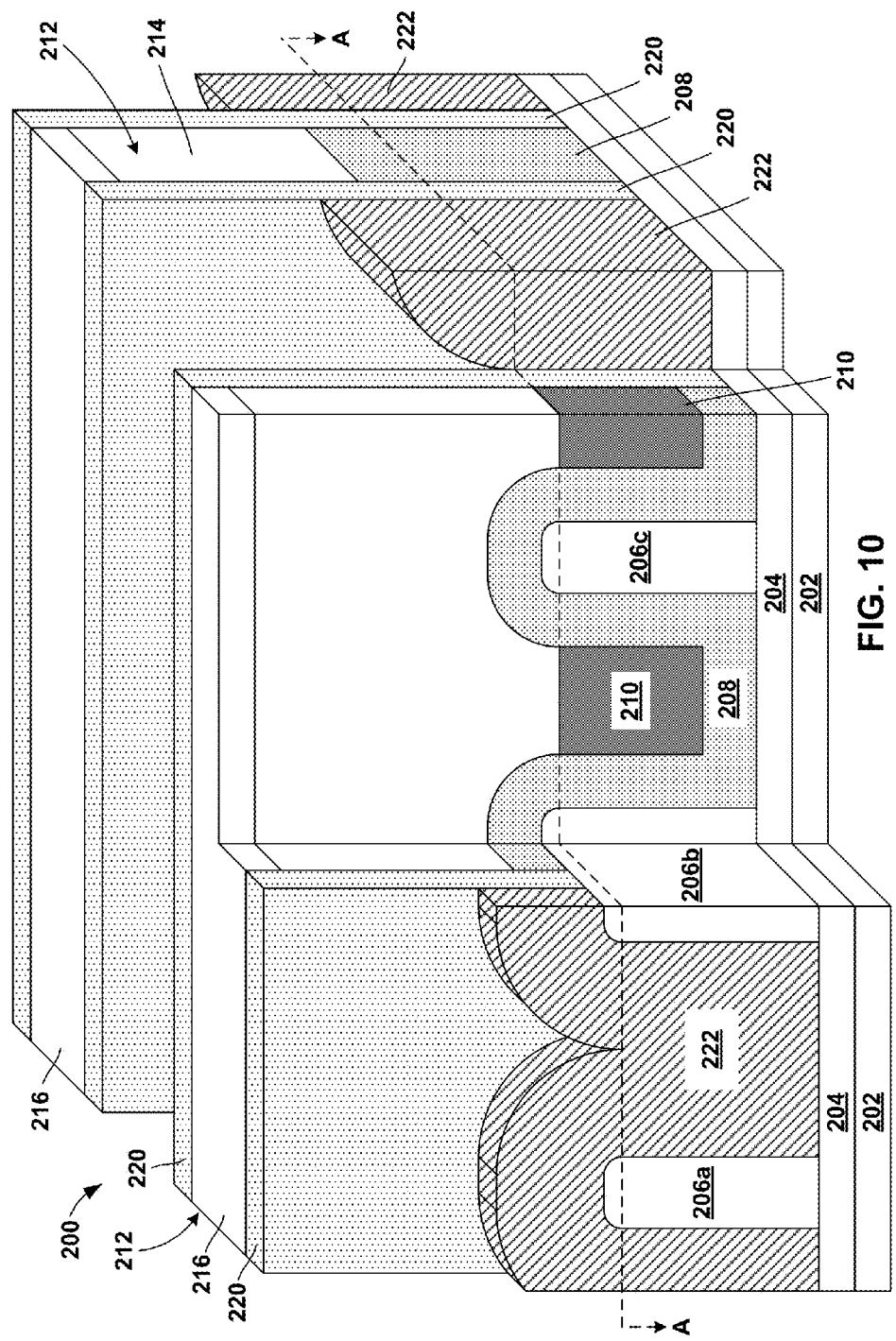

Referring now to FIG. 10, the isometric view of the structure 200 is shown after an EPI region 222 may be grown on top of the plurality of fins 206a-206c exposed in the source-drain regions. The portion of the fins 206a-206c exposed in the source-drain regions of the structure 200 may be either n-doped or p-doped, and function as a source or drain of a resulting finFET device. Typically, n-doped source-drains are used for forming n-channel field effect transistors (n-FETs), and p-doped source-drains are used for forming p-channel field effect transistors (p-FETs). However, the source-drains of one device on a semiconductor substrate may be n-doped while the source-drains of another device on the same semiconductor substrate may be p-doped. Methods well known in the art may be use to implant the source-drains either before, during or after growing the EPI region 222. Thus the EPI region 222 may be doped after being grown on the portion of the fins 206a-206c exposed in the source-drain regions of the structure 200. In cases where both n-FETs and p-FETs are desired, masking materials, such as, for example, photoresist, $SiO_2$, $Si_3N_4$ or $HfO_2$, may be used to distinguish between the two different types of devices during the formation of the doped source-drain regions.

The EPI region 222 may be grown using any suitable technique known in the art. For example, the EPI region 222 may be grown at a temperature ranging from about 700° C. to about 1000° C., for example using a CVD, low-pressure (LP) CVD, ultra-high vacuum (UHV) CVD or any method known in art in conjunction with a silane, dichlorosilane, germane or other suitable precursor gas. The EPI region 222 may be doped in-situ, for example, by adding $AsH_3$, $PH_3$, or $BH_3$ to the gas mixture. Alternatively, in one embodiment, the EPI region 222 may be doped with a first type dopant, while the fins 206a-206c may be doped with a second type dopant. In-situ doping refers to the doping technique in which the dopants are introduced into the EPI region 222 at the same time the EPI region 222 is being grown. In-situ doping may be attractive because the dopant distribution can be uniform throughout the region if the dopant is incorporated during and along with the growth of the EPI region 222. In one embodiment, the EPI region 222 may have a thickness ranging from about 5 nm to about 20 nm, with a doping concentration within a range of about $5 \times 10^{19}$ atoms per $cm^3$ to about $1 \times 10^{21}$ atoms per $cm^3$.

Figure 11:
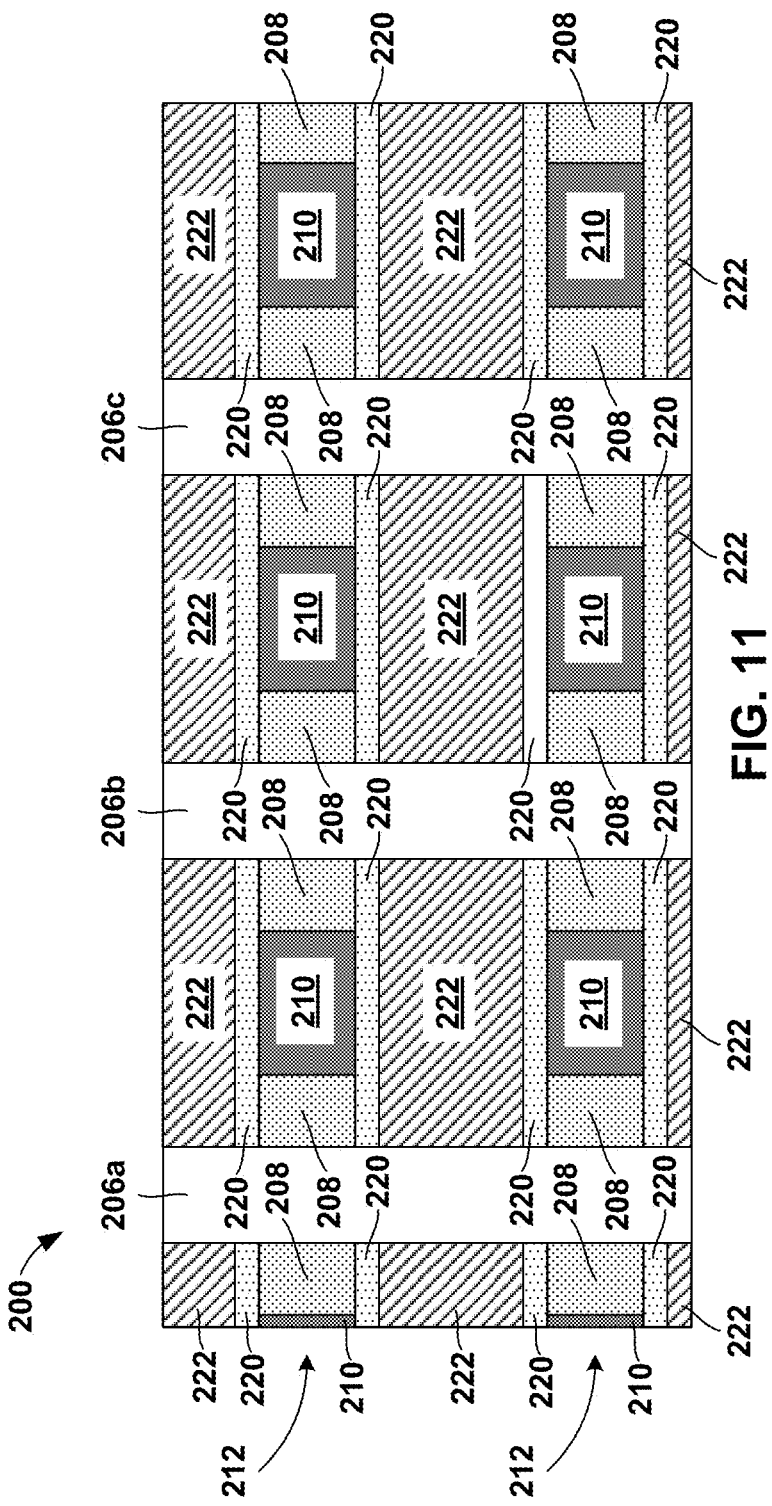

Referring now to FIG. 11, a cross section view, section A-A, of FIG. 10 is shown. The pocket 218 (FIG. 9) in the source-drain regions of the structure 200 may be substantially filled with the EPI region 222. Therefore, the EPI region 222 occupies the open space (i.e. the pocket 218 of FIG. 9) between adjacent dummy gate lines 212. Also, it should be noted that only the spacers 220 may separate the dummy gate lines 212 from the EPI region 222. More specifically, only the spacers 220 may separate the dummy gate oxide 208 and the gap fill material 210 from the EPI region 222.

Figure 12:
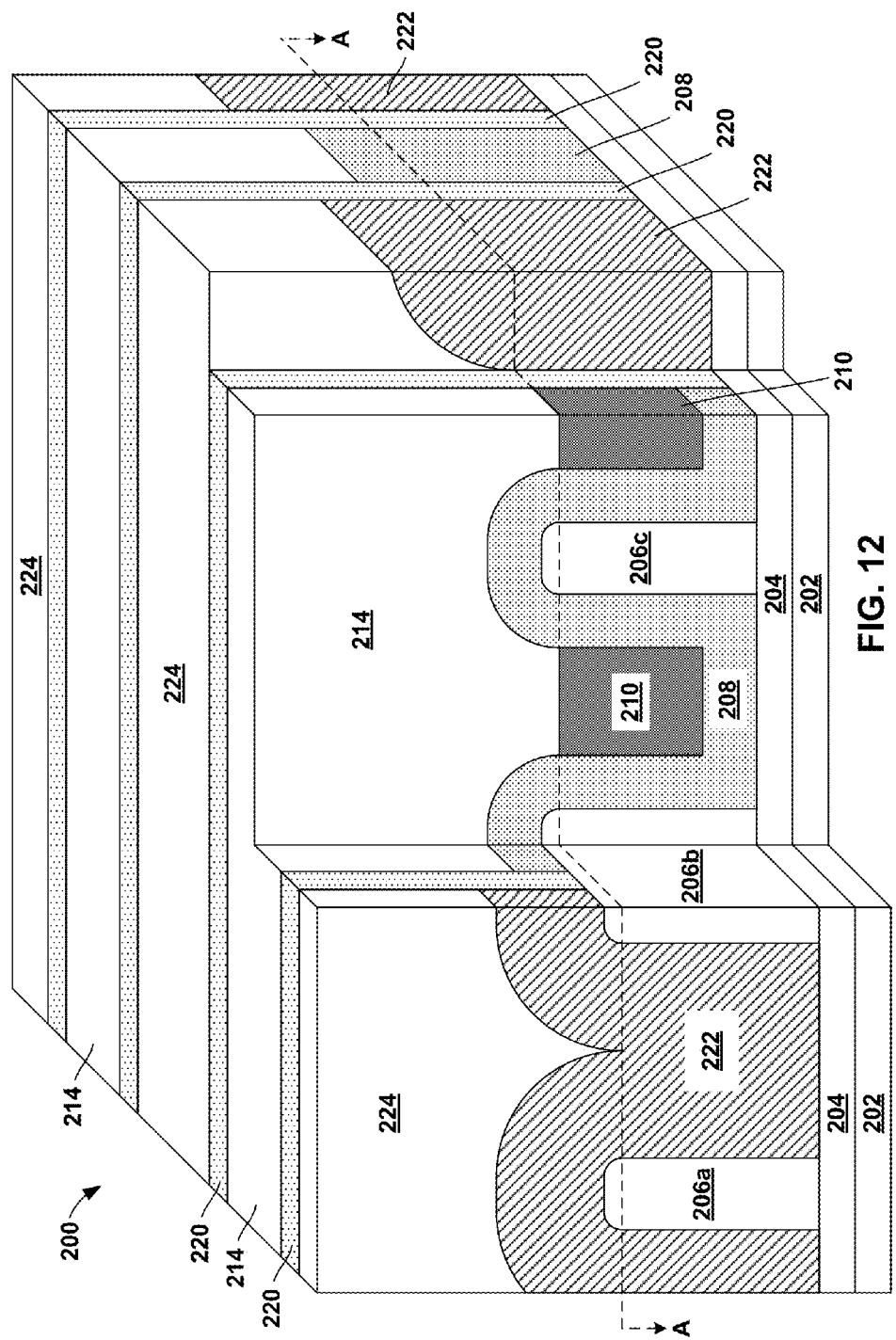

Referring now to FIG. 12, the isometric view of the structure 200 is shown after the formation of a dielectric layer 224. The dielectric layer 224 may generally be deposited above the EPI region 222 in the source-drain regions of the structure 200. The dielectric layer 224 may include any suitable dielectric material, for example, silicon oxide ($SiO_2$), silicon nitride ($Si_3N_4$), hydrogenated silicon carbon oxide (SiCOH), silicon based low-k dielectrics, or porous dielectrics. Known suitable deposition techniques, such as, for example, atomic layer deposition, chemical vapor deposition, plasma enhanced chemical vapor deposition, spin on deposition, or physical vapor deposition may be used to form the dielectric layer 224. Next, a chemical mechanical polishing technique may be applied to remove excess material from a top surface of the structure 200 and expose the dummy gate 214. The chemical mechanical polishing technique may remove substantially all of the dummy gate cap 216 selective to the dummy gate 214.

Figure 13:
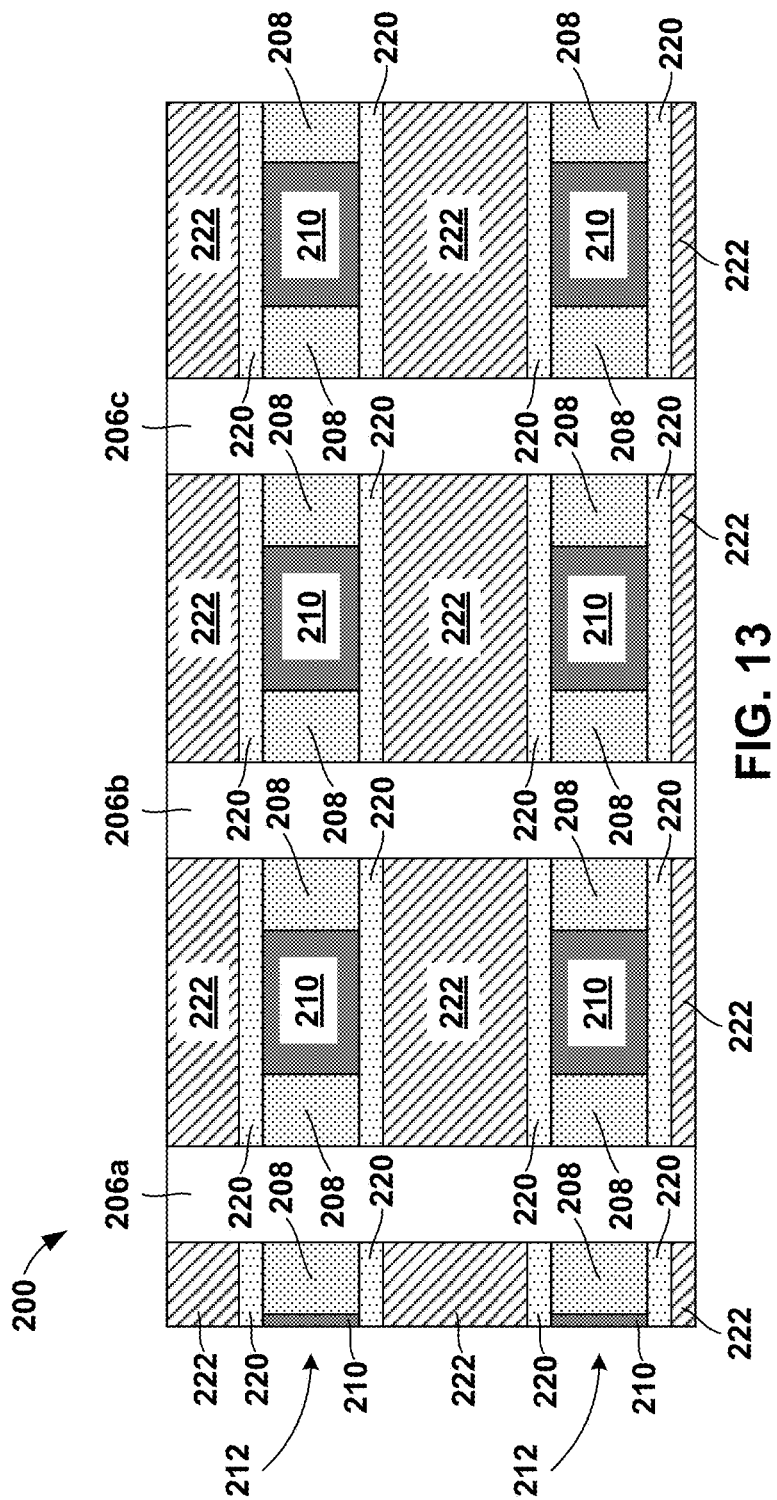

Referring now to FIG. 13, a cross section view, section A-A, of FIG. 12 is shown. The cross section view may not reveal any change in the structure 200 after the addition of the dielectric layer 224 as the view is shown from below the EPI region 222.

Figure 14:
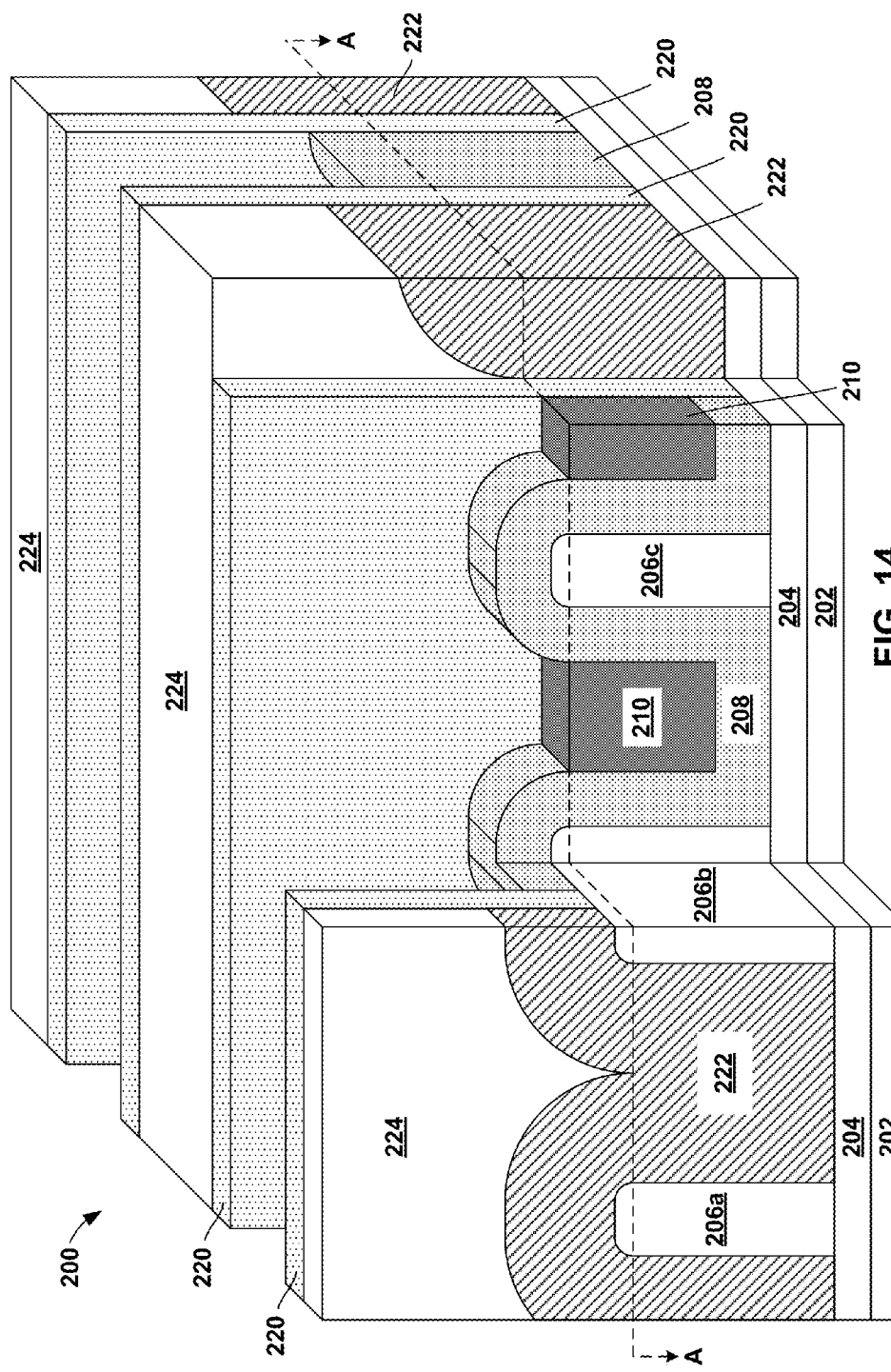

Referring now to FIG. 14, the isometric view of the structure 200 is shown after the dummy gate 214 may be substantially removed from the gate region of the structure 200. The dummy gate 214 may be removed selective to the dummy gate oxide 208 and the gap fill material 210. Furthermore, the chosen dielectric layer 224 may be resistant to the etching technique chosen to remove the dummy gate 214. The selective removal of the dummy gate 214 may be accomplished by using any known etching technique suitable to remove polysilicon selective to silicon oxide and silicon nitride. In one embodiment, for example, the dummy gate 214 may be removed using a dry etching technique, for example reactive ion etching.

Figure 15:
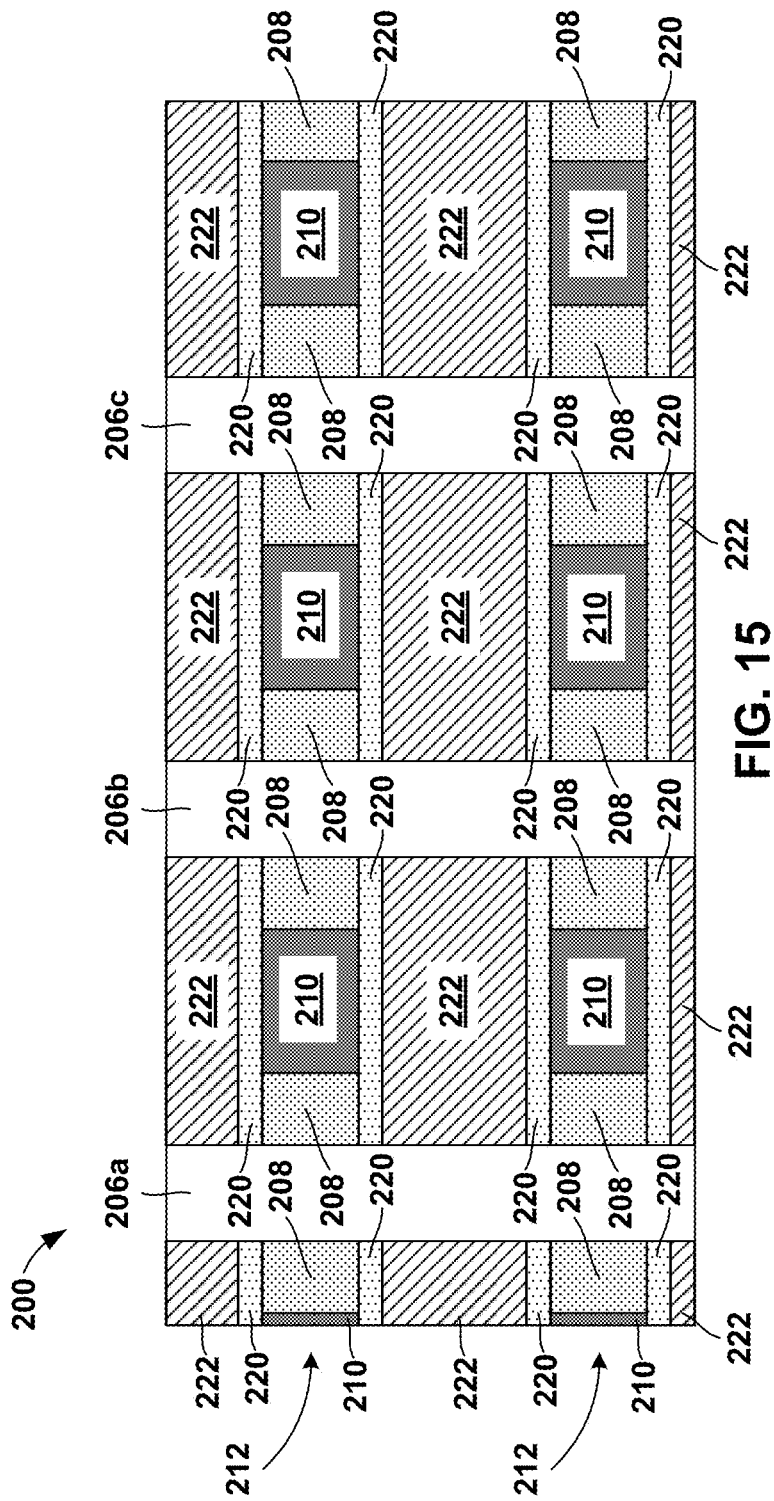

Referring now to FIG. 15, a cross section view, section A-A, of FIG. 14 is shown. The cross section view may not reveal any change in the structure 200 after the removal of the dummy gate 214 as the view is shown from below the dummy gate 214.

Figure 16:
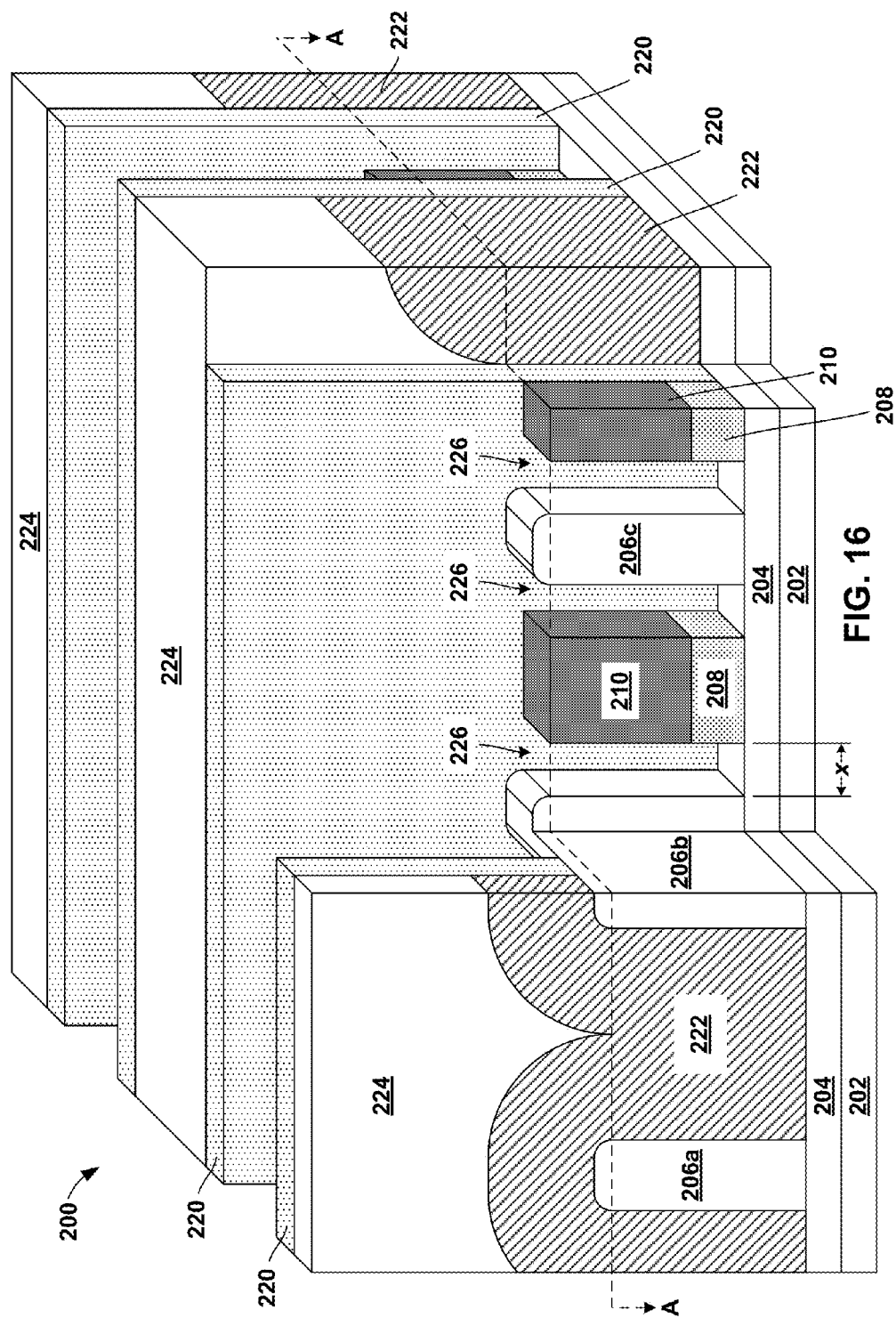

Referring now to FIG. 16, the isometric view of the structure 200 is shown after the dummy gate oxide 208 may be substantially removed from the gate regions of the structure 200. The dummy gate oxide 208 may be removed selective to the gap fill material 210, and the plurality of fins 206a-206c. Furthermore, removal of the dummy gate oxide 208 may expose a portion of the buried dielectric layer 204, in the gate region of the structure 200. The selective removal of the dummy gate oxide 208 may be accomplished by using any known etching technique suitable to remove silicon oxide selective to silicon nitride, and silicon. In one embodiment, for example, the dummy gate oxide 208 may be removed using a dry etching technique, for example reactive ion etching.

In the present embodiment, the dielectric layer 224, the spacers 220, the plurality of fins 206a-206c, and the gap fill material 210 may all function as self-aligned masks. A portion of the dummy gate oxide 208 may remain beneath the gap fill material 210 due to the placement of the gap fill material 210, and the anisotropic nature of the chosen etching technique. The remaining portion of the dummy gate oxide 208 and the gap fill material 210 may be positioned between two adjacent fins, for example 206b and 206c, and define one or more openings 226. Therefore, openings 226 may be positioned between the fins 206a-206c and the gap fill material 210 in the gate regions of the structure 200. The width (x) of the openings 226, as measured from the gap fill material 210 to a fin, may be approximately equal to the thickness of the dummy gate oxide 208.

Figure 17:
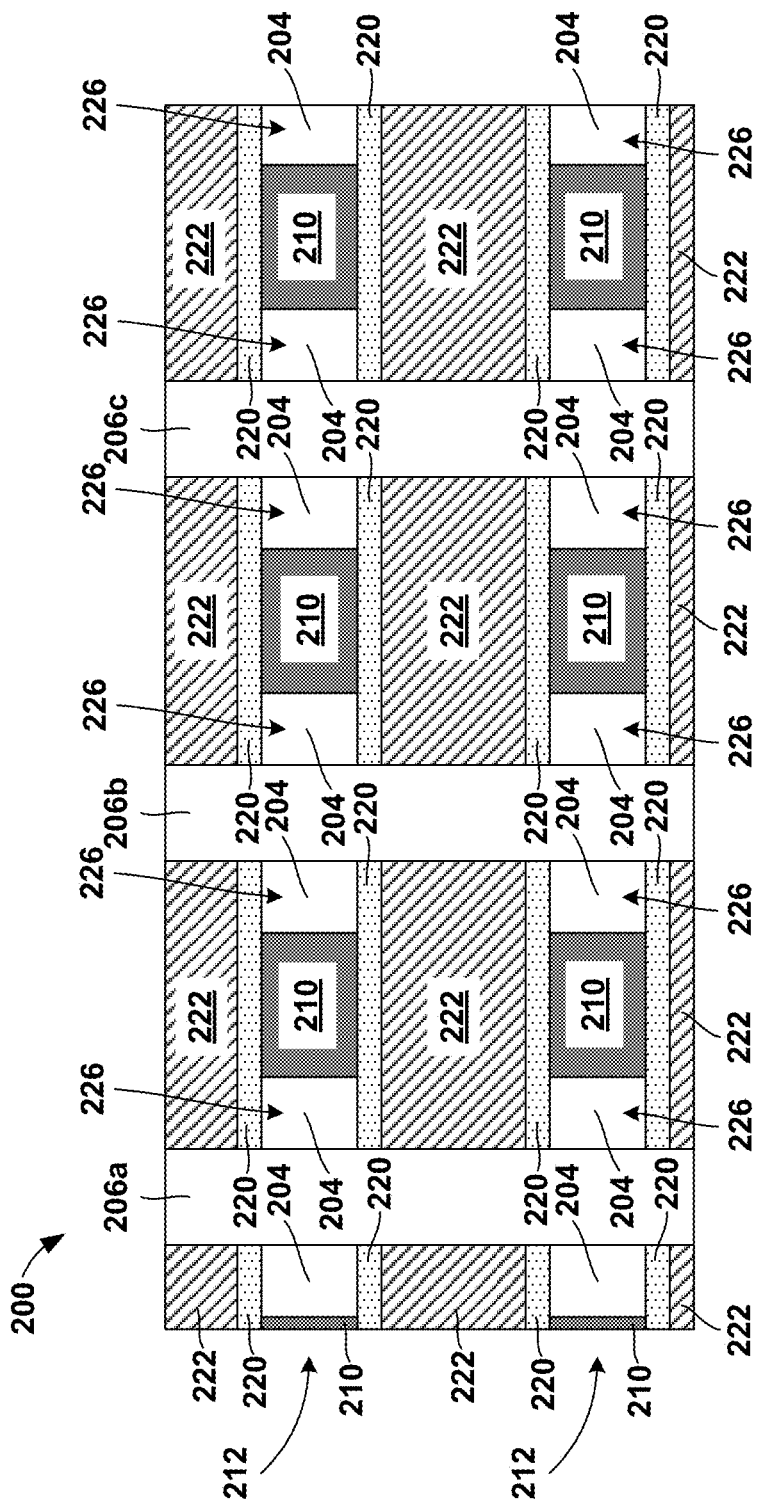

Referring now to FIG. 17, a cross section view, section A-A, of FIG. 16 is shown. The openings 226 in the gate region of the structure 200 are shown between a fin, for example the fin 206b, and the gap fill material 210. As mentioned above, the buried dielectric layer 204 may be exposed at the bottom of the openings 226.

Figure 18:
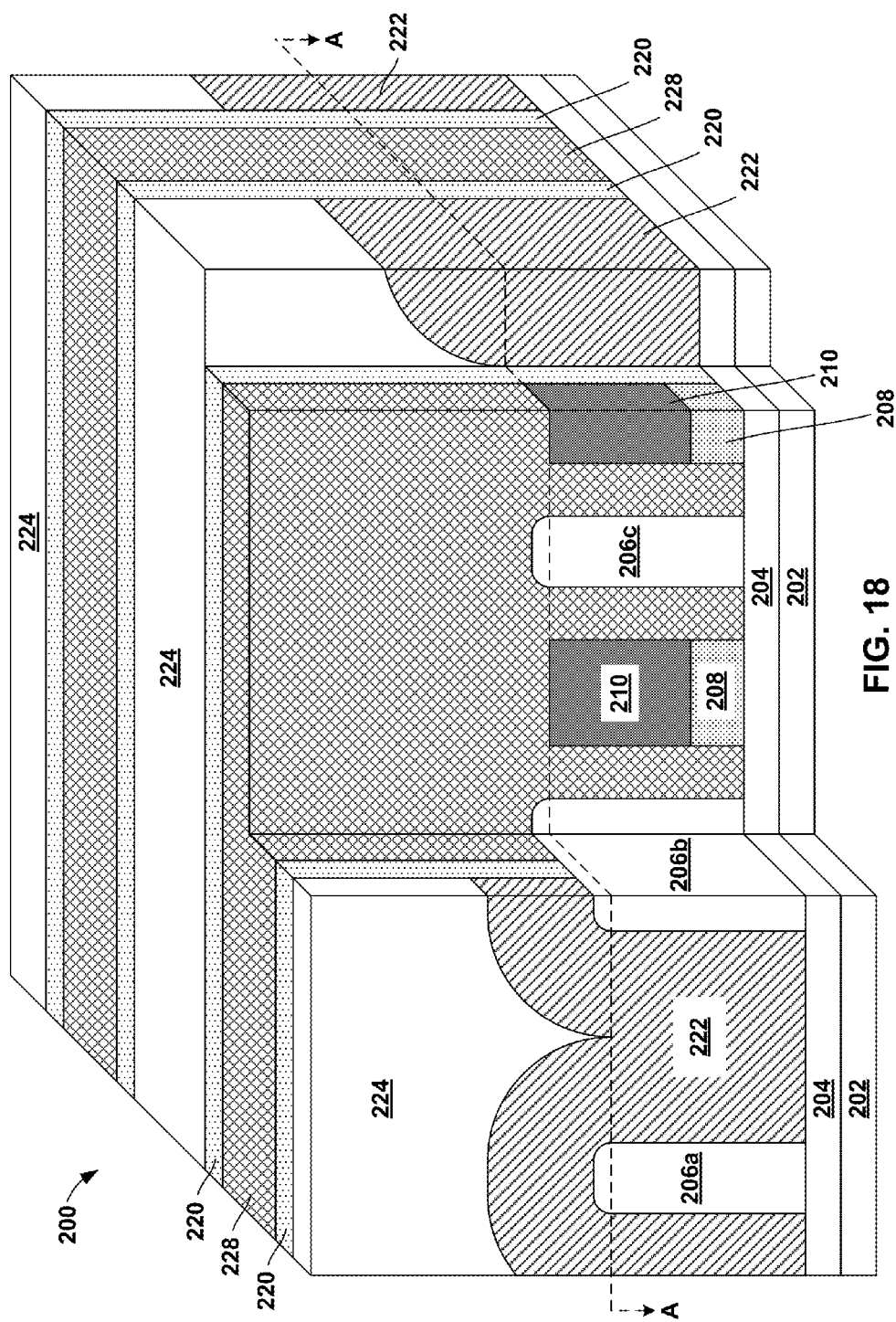

Referring now to FIG. 18, the isometric view of the final structure 200 is shown. Typical replacement gate fabrication techniques well known in the art may be used to form a gate electrode 228 and complete the formation of the structure 200. In one embodiment, a gate oxide (not shown) may be deposited prior to forming the gate electrode 228. The gate oxide may include any of the high-k dielectric materials known in the art, for example $HfO_2$, and deposited with methods such as atomic layer deposition (ALD), chemical vapor deposition (CVD), or physical vapor deposition (PVD). The gate electrode 228 may include one or more work function metals such as TiN, TaN, or TiC, to achieve the desired device threshold voltage and one or more low resistance metal such as W, Al, or Co. The gate electrode 228 may substantially fill the openings 226 (FIG. 16), and substantially cover and surround the gap fill material 210. Formation of the gate electrode 228 between adjacent fins may be limited to the openings 226 (FIG. 16) due to the placement of the gap fill material 210.

Figure 19:
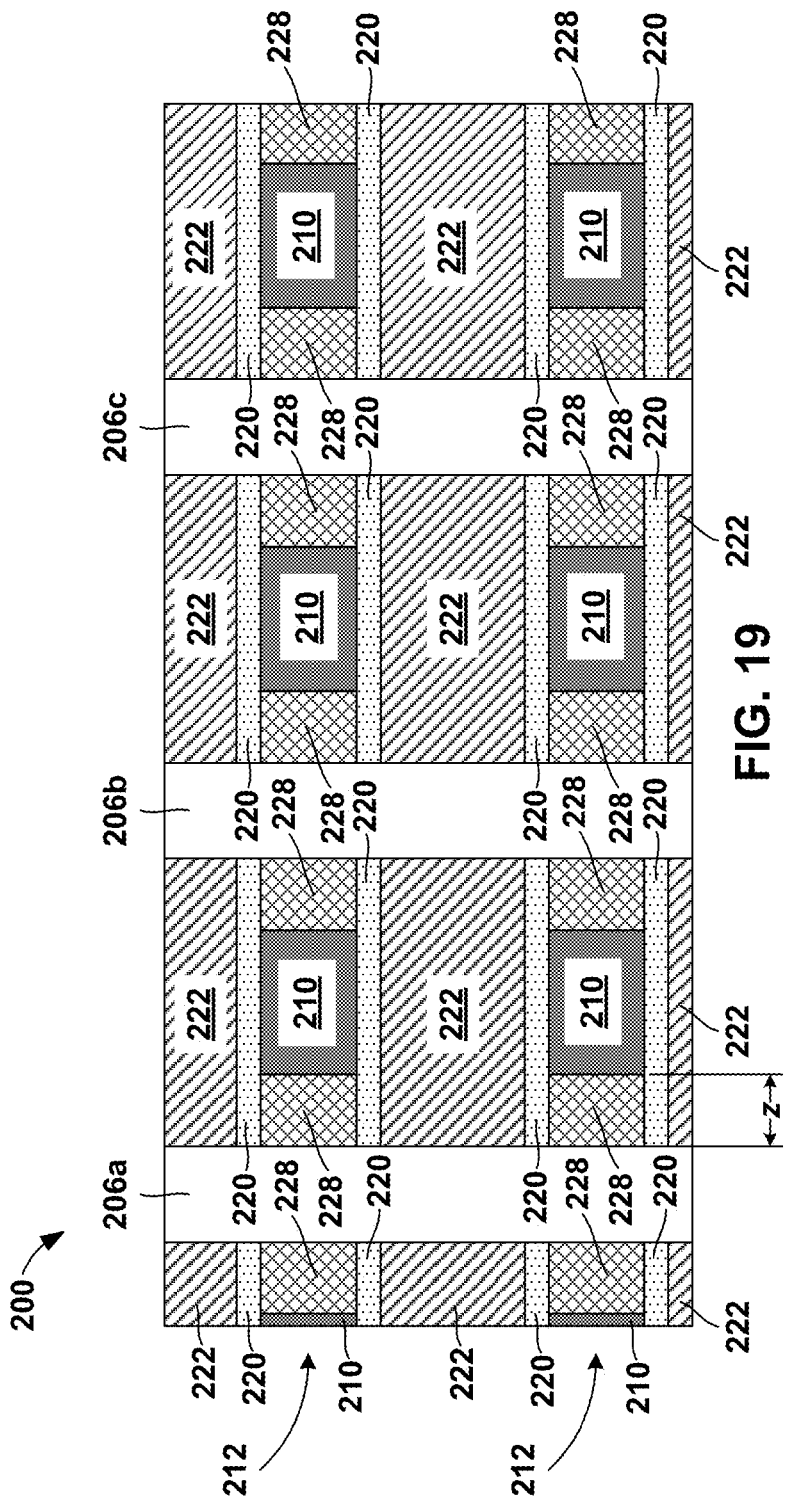

Referring now to FIG. 19 a cross section view, section A-A, of FIG. 18 is shown. It should be noted, again, that the section A-A is a view of the structure 200 below the top surface of the fins 206a-206c. In the present embodiment, the gate electrode 228 may be deposited along the sidewalls of the fins 206a-206c where it may be most functional to the operation of the finFET device. The thickness of the dummy gate oxide 208 may dictate the width (x) of the openings 226 (FIG. 16) and thus the width (z) of the gate electrode 228. Therefore, the thickness of the dummy gate oxide 208 may be chosen specifically to accommodate a high-k gate oxide and a suitable thickness of the work function metal of the gate electrode 228. Since the threshold voltage of the transistor depends on the thickness of the work function metal among other parameters, the fact that the thickness of the work function metal is pre-determined by the thickness of the dummy gate oxide 208 may advantageously reduce the variability in the threshold voltage of the resulting transistor.

Below the top surface of the fins 206a-206c, the gate electrode 228 does not extend from one fin to the adjacent fin, like the gate electrode 108 of FIG. 2. The location and placement of the gap fill material 210 may substantially reduce the amount of gate electrode 228 deposited between two adjacent fins. Reducing the amount of gate electrode 228 between the fins may effectively reduce the parasitic capacitance exhibited by similar structures without the gap fill material 210. See FIG. 2. As described above, a capacitor may include two electrical conductors separated by an insulator, and decreasing the size of one of the two electrical conductors may reduce the capacitance between the two electrodes. Therefore, if the EPI region 222 and the gate electrode 228 are electrical conductors separated by one spacer 220, an insulator, reducing of the amount of gate electrode 228 between the fins, effectively decreases the size of one of the two electrodes and may reduce the capacitance between the gate electrode 228 and the EPI region 222.

Another exemplary embodiment by which to reduce the parasitic capacitance is described in detail below by referring to the accompanying drawings in FIGS. 20-27. In the present embodiment, a gap fill material may be incorporated into a typical RG process flow to effectively reduce the EPI region in close proximity to the gate electrode. It should be noted that the process and techniques described above with reference to FIGS. 3-5 may be applied directly to the present embodiment and the following embodiment and corresponding description will build on the above description.

Figure 20:
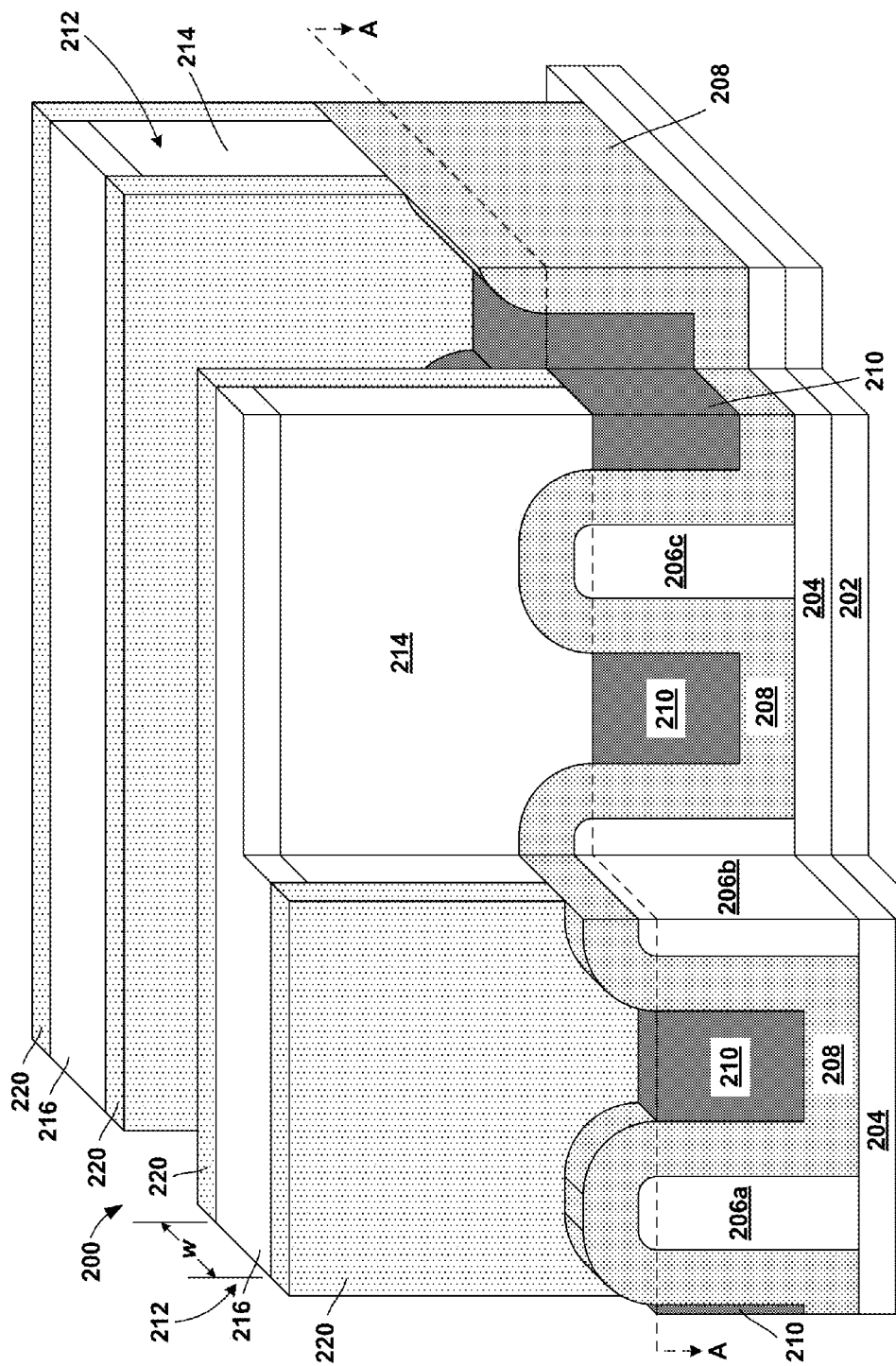
FIGS. 20-27 illustrate the steps of a method of forming a finFET according to another exemplary embodiment.

Referring now to FIG. 20, the isometric view of the structure 200 is shown after the formation of multiple dummy gate lines 212, similar to that described above. Similar deposition and etching techniques as those described above may be used to form the dummy gate lines 212. Unlike the above embodiment, the dummy gate oxide 208 and the gap fill material 210 may not be removed during patterning of the dummy gate lines 212. The dummy gate lines 212 may be pattered selective to the dummy gate oxide 208 and the gap fill material 210. Therefore, in the present embodiment, the fins 206a-206c may remain covered by the dummy gate oxide 208 and the gap fill material 210. Furthermore, the spacers 220 may be formed on the sidewalls of the dummy gate lines 212, like above.

Figure 21:
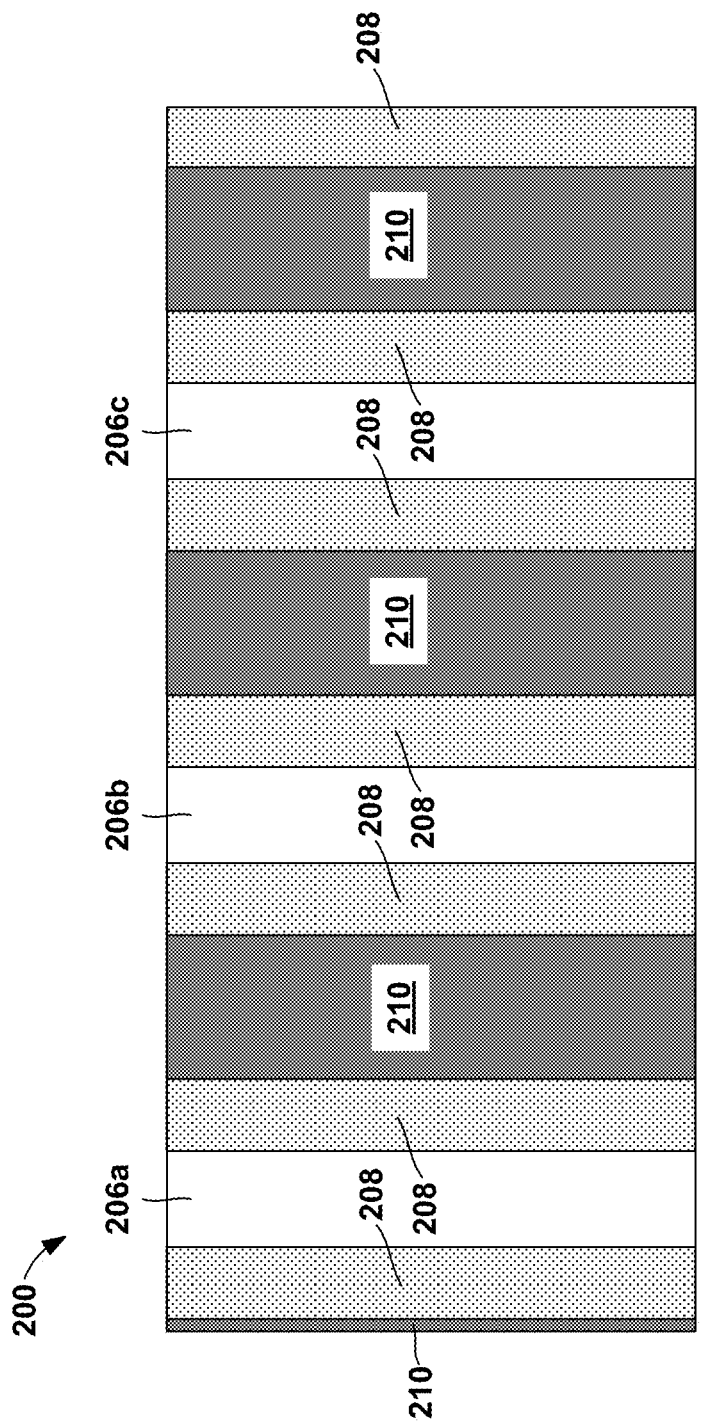

Referring now to FIG. 21, a cross section view, section A-A, of FIG. 20 is shown. The technique used to pattern the dummy gate lines 212 may leave both the dummy gate oxide 208 and the gap fill material 210 substantially untouched. FIG. 21 of the present embodiment may be distinguished from FIG. 7 of the previously described embodiment, in that the buried dielectric layer 204 may remain substantially covered by the dummy gate oxide 208 and the gap fill material 210 in FIG. 21.

Figure 22:
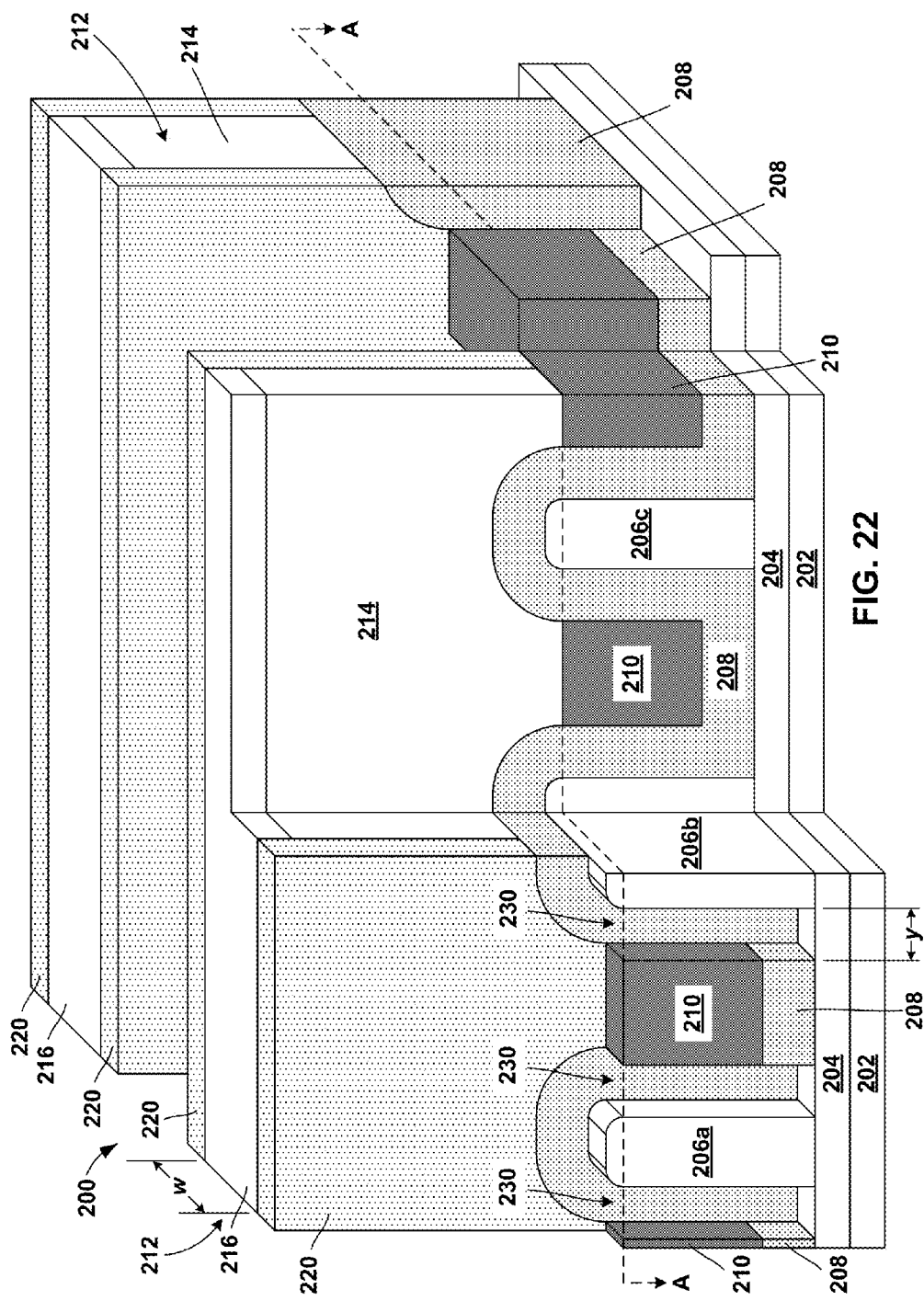

Referring now to FIG. 22, the isometric view of the structure 200 is shown after the dummy gate oxide 208 may be substantially removed from the source-drain regions of the structure 200 selective to the gap fill material 210, and the plurality of fins 206a-206c. Like above, similar techniques as those described above may be used to remove the dummy gate oxide 208, and expose a portion of the buried dielectric layer 204.

In the present embodiment, the spacers 220, the dummy gate cap 216 the plurality of fins 206a-206c, and the gap fill material 210 may all function as self-aligned masks. Like above, a portion of the dummy gate oxide 208 may remain beneath the gap fill material 210 due to the placement of the gap fill material 210, and the anisotropic nature of the chosen etching technique. The remaining portion of the dummy gate oxide 208 and the gap fill material 210 may be positioned between two adjacent fins, for example 206b and 206c, and define one or more openings 230. Therefore, openings 230 may be positioned between the fins 206a-206c and the gap fill material 210 in the source-drain regions of the structure 200. Unlike the openings 226 above, the openings 230 may be formed adjacent to the dummy gate lines 212 and not beneath the dummy gate lines 212. The width (y) of the openings 230, as measured from the gap fill material 210 to the fins 206a-206c, may be approximately equal to the thickness of the dummy gate oxide 208.

Figure 23:
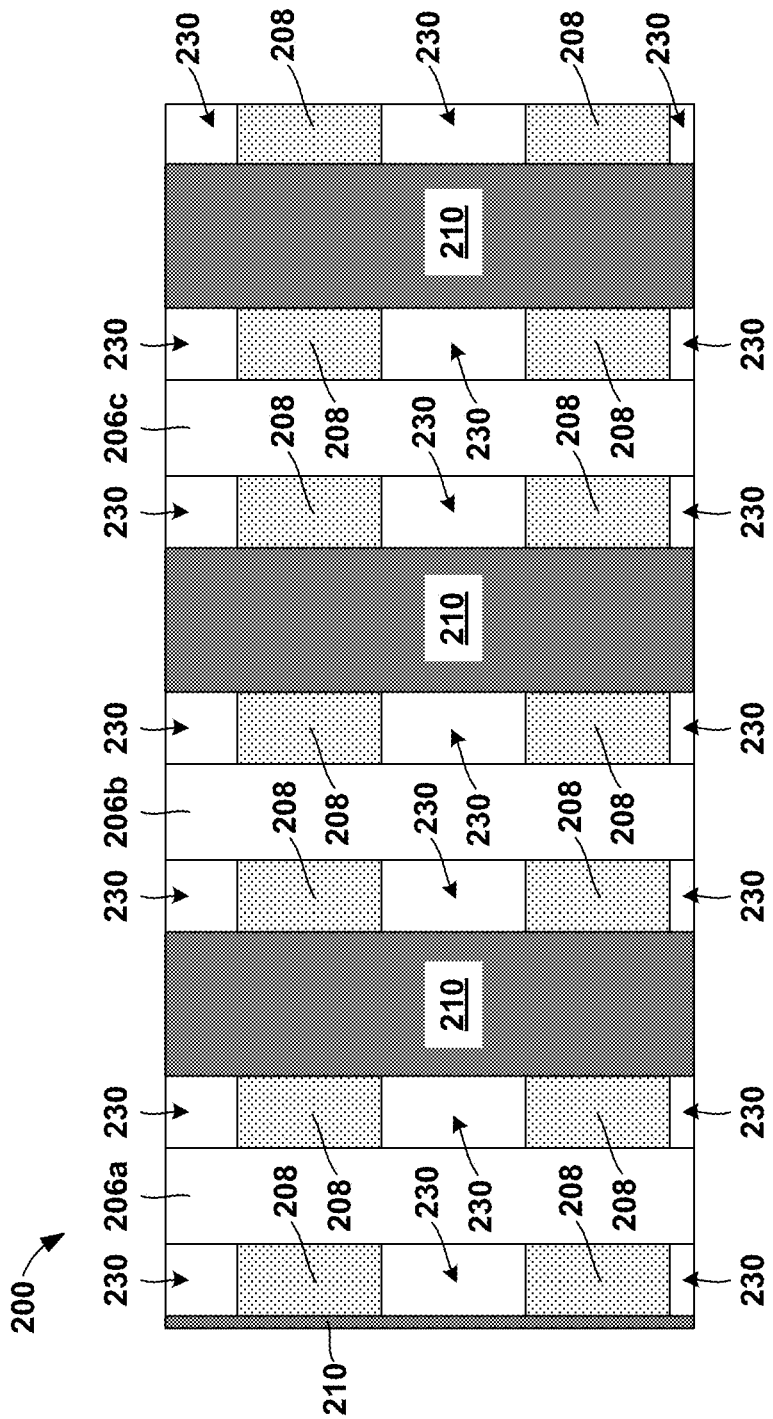

Referring now to FIG. 23, a cross section view, section A-A, of FIG. 22 is shown. The openings 230 in the source-drain regions of the structure 200 are shown between a fin, for example the fin 206b, and the gap fill material 210. As mentioned above, the buried dielectric layer 204 may be exposed at the bottom of the openings 230.

Figure 24:
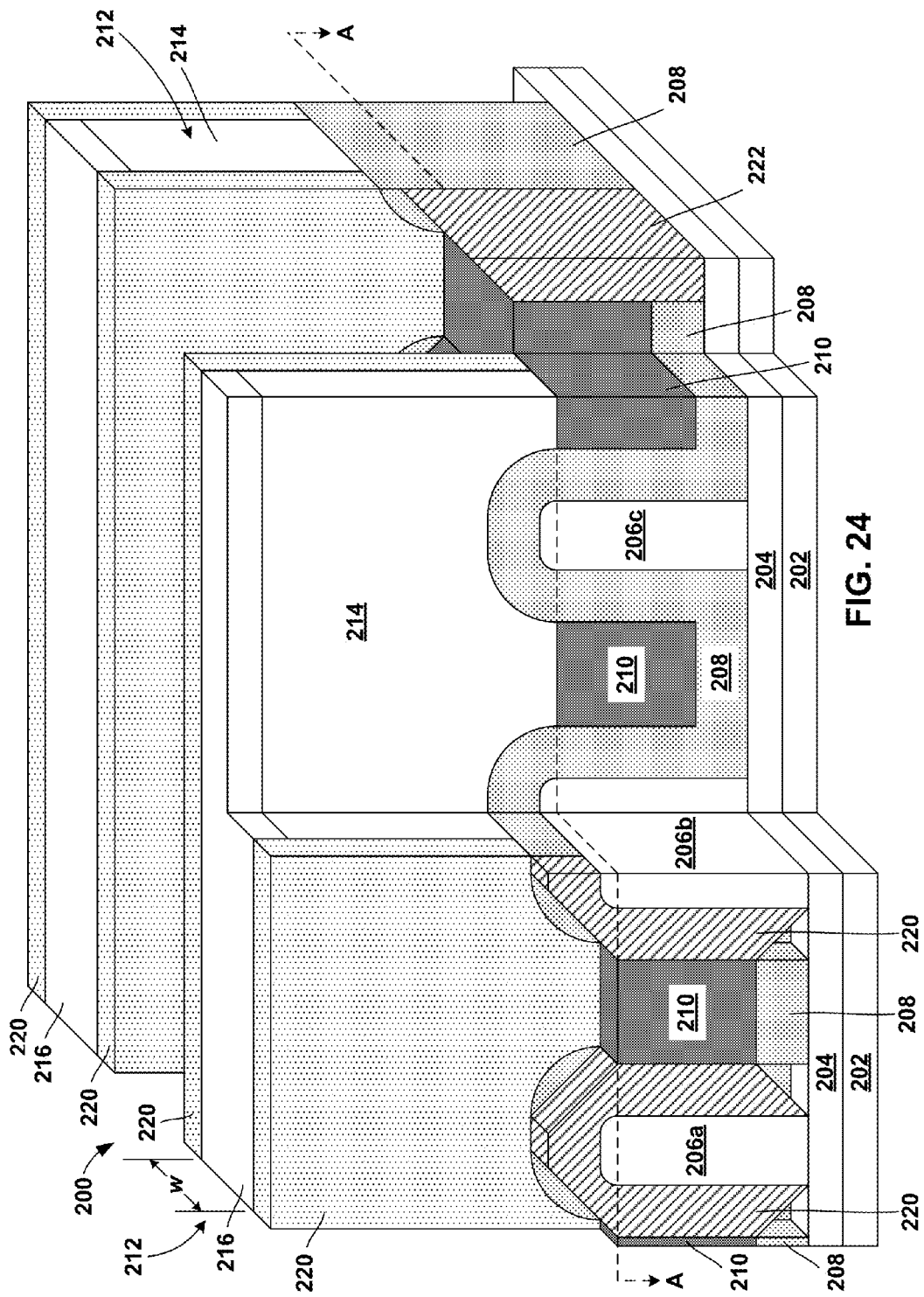

Referring now to FIG. 24, the isometric view of the structure 200 is shown after an EPI region 222 may be grown in the openings 230 (FIG. 22) and on top of the plurality of fins 206a-206c exposed in the source-drain regions of the structure 200. Growth of the EPI region 222 may be limited by the portion of the dummy gate oxide 208 and the gap fill material 210 remaining in the source-drain regions of the structure 200. Like above, methods well known in the art may be use to implant the source-drains either before, during or after growing the EPI region 222. It should be noted, the EPI regions 222 may be faceted (as depicted) if a faceted epitaxial growth process is used. In such cases, the epitaxial growth slows down significantly of a certain crystallographic plane, for example, {111} planes are formed. Alternatively, a conformal epitaxial growth technique may be used to yield a more conformal formation. Epitaxial growth methods and conditions to form either a faceted or a non-faceted epitaxial layer are known in the prior art.

Figure 25:
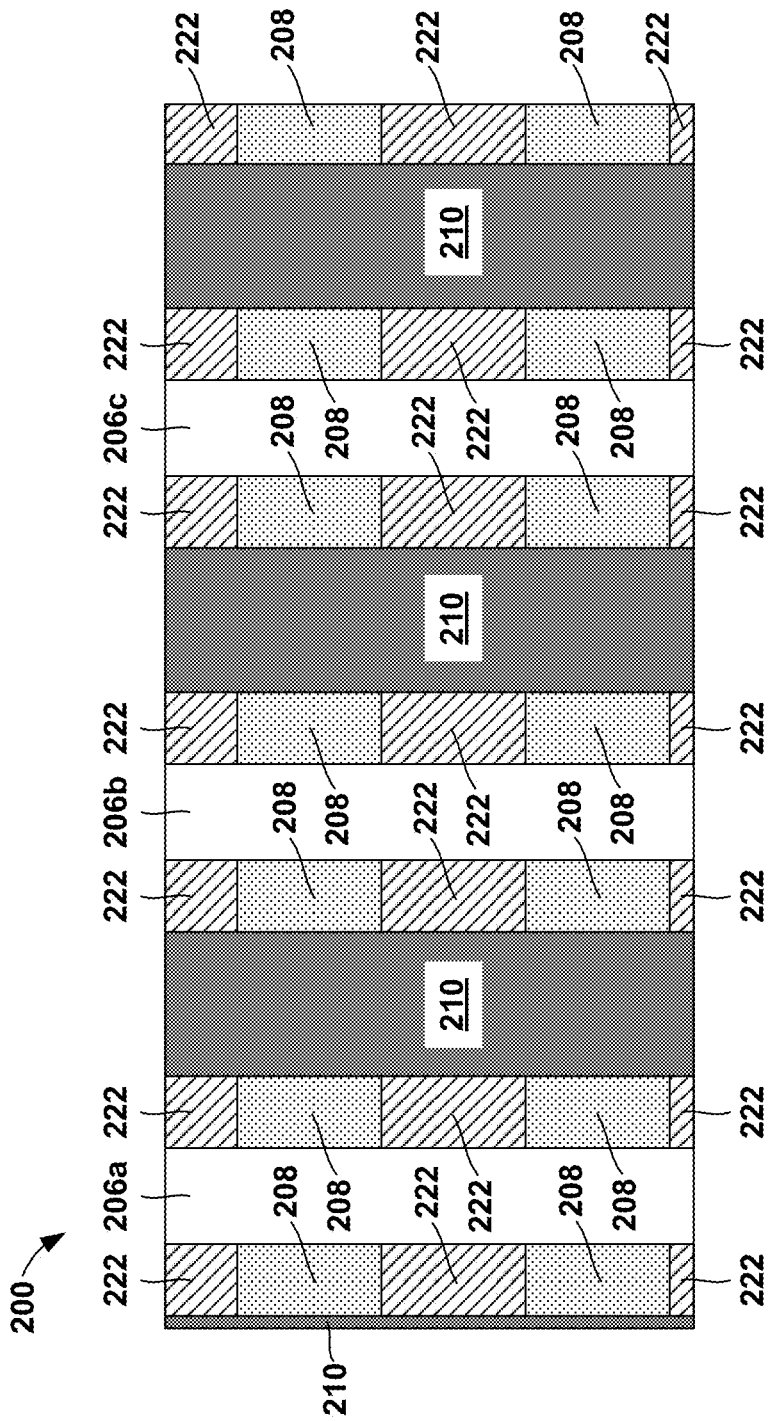

Referring now to FIG. 25, a cross section view, section A-A, of FIG. 24 is shown. The openings 230 (FIG. 9) in the source-drain regions of the structure 200 may be substantially filled with the EPI region 222. Therefore, it may be evident from the figure, that the EPI region 222 is smaller as a result of the gap fill material 210. See FIG. 11 for a comparison.

Figure 26:
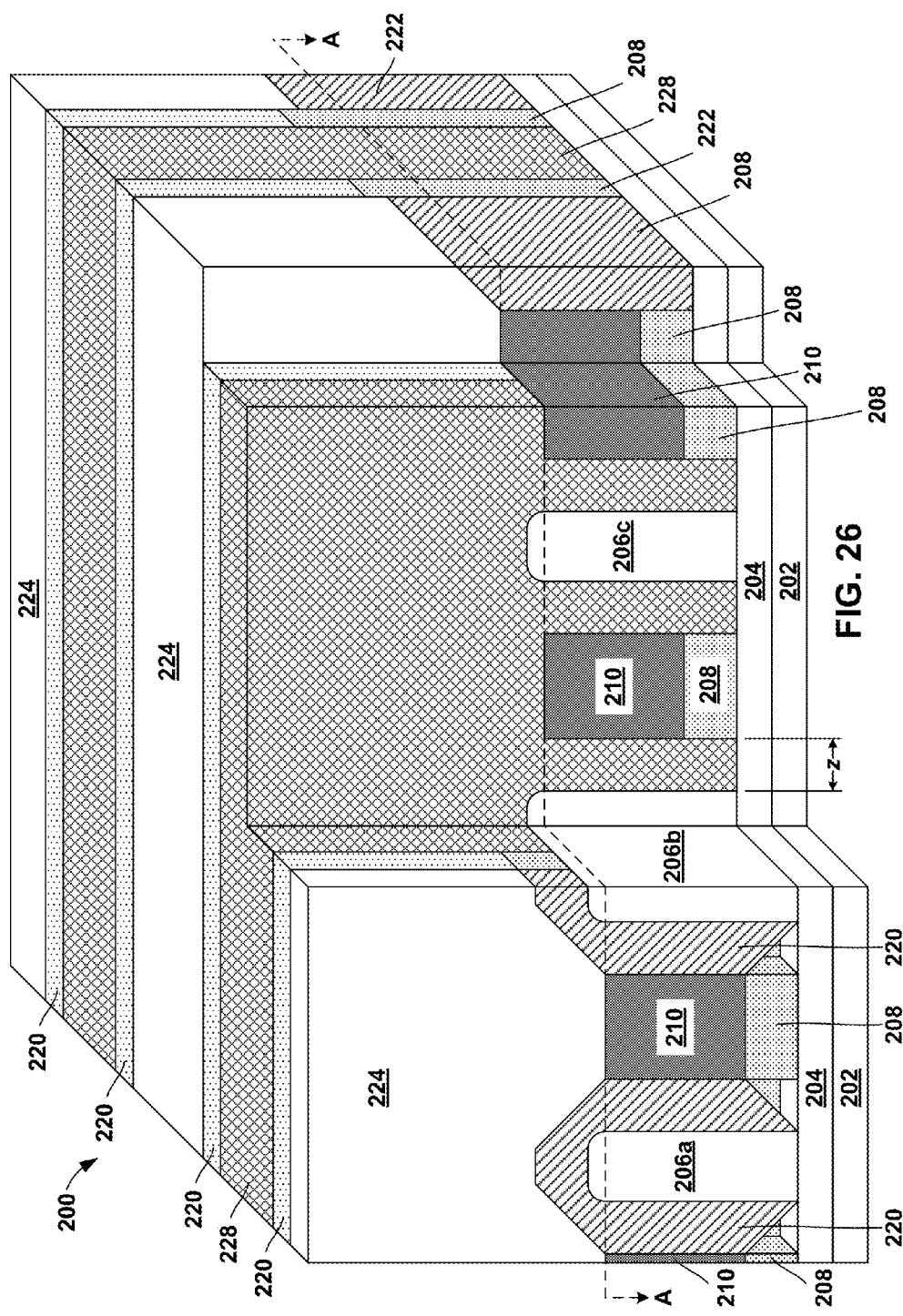
Figure 27:
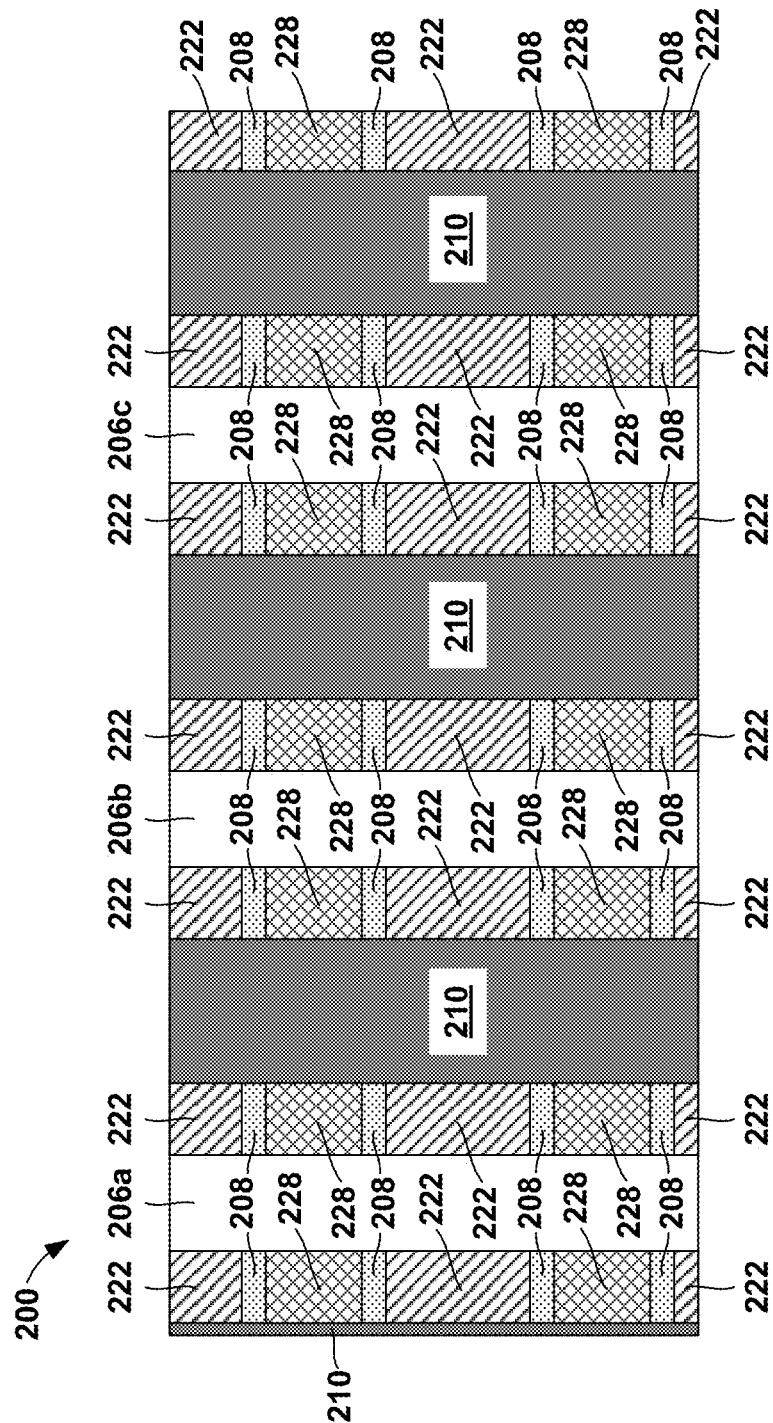

Referring now to FIG. 26, the isometric view of the final structure 200 is shown. The steps described in detail above with reference to FIGS. 12-19 may be followed to achieve the final structure as illustrated in the figure. First, the dielectric layer 224 may be deposited followed by a chemical mechanical polishing technique, as described above. Next, the dummy gate 214 may be removed and replaced with the gate electrode 228, as described above. It should be noted that typical RG fabrication techniques may be used to achieve the final structure illustrated in the figure. In the present embodiment, both the gate electrode 228 and the EPI region 222 may be limited due to the placement of the gap fill material 210. In one embodiment, typical RG processing may allow for the gate electrode 228 to fill the space between adjacent fins and placement of the gap fill material 210 may only limit the EPI region 222.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   depositing a gap fill material on top of a conformal dummy gate oxide above and in between a plurality of fins;
   forming one or more openings between the plurality of fins and the gap fill material by selectively removing a portion of the conformal dummy gate oxide; and
   forming a gate within the one or more openings, and above the plurality of fins and the gap fill material.

2. The method of claim 1, further comprising:
   removing the conformal dummy gate oxide and the gap fill material selective to a portion of the plurality of fins not covered by the gate; and
   forming an epitaxially grown region ("EPI region") above the portion of the plurality of fins not covered by the gate.

3. The method of claim 1, further comprising:
   forming an EPI region within the one or more openings and on a portion of the plurality of fins not covered by the gate.

4. The method of claim 2, further comprising:
   depositing a dielectric layer on top of the EPI regions.

5. The method of claim 1, wherein depositing the gap fill material on top of the conformal dummy gate oxide and in between the plurality of fins comprises:
   removing a portion of the gap fill material to expose the conformal dummy gate oxide.

6. The method of claim 1, wherein depositing the gap fill material on top of the conformal dummy gate oxide and in between the plurality of fins comprises:
   depositing a material that will allow for removal of the conformal dummy gate oxide selective to the gap fill material.

7. The method of claim 1, wherein depositing the gap fill material on top of the conformal dummy gate oxide and in between the plurality of fins comprises:
   depositing a material that has a slower etch rate than the conformal dummy gate oxide under the same etch conditions.

8. The method of claim 1, wherein depositing the gap fill material on top of the conformal dummy gate oxide and in between the plurality of fins comprises:
   depositing silicon nitride.

9. The method of claim 1, wherein forming the gate within the one or more openings, and above the plurality of fins and the gap fill material comprises:
   depositing a high-k gate dielectric material;
   depositing one or more work function metals; and
   depositing a low resistance metal.

10. The method of claim 1, wherein forming the gate within the one or more openings, and above the plurality of fins and the gap fill material comprises:
    using a gate last fabrication technique.

11. A method comprising:
    depositing a gap fill material directly on top of a conformal dummy gate oxide above and in between fins such that a portion of the conformal dummy gate oxide immediately above the fins remains exposed;
    depositing a dummy gate directly on top of the conformal dummy gate oxide and directly on top of the gap fill material;
    patterning the dummy gate, the gap fill material, and the conformal dummy gate oxide into dummy gate lines oriented perpendicular to the fins, a portion of the fins not covered by the dummy gate lines are exposed, and a portion of the gap fill material remains covered by the dummy gate;
    forming spacers directly on opposite sidewalls of the dummy gate lines, including on sidewalls of the dummy gate, on sidewalls of the gap fill material and on sidewalls of the conformal dummy gate oxide;
    removing the dummy gate from between the spacers exposing the conformal dummy gate oxide and the gap fill material;
    forming one or more openings between the fins and the gap fill material by selectively removing a portion of the conformal dummy gate oxide, another portion of the conformal dummy gate oxide remaining directly beneath the gap fill material; and
    forming a gate within the one or more openings, the gate is in direct contact with both the fins and the gap fill material.

12. The method of claim 11, wherein a top surface of the gap fill material is at or below a top surface of the fins.

13. The method of claim 11, wherein a top surface and two opposite sides of the gap fill material are in direct contact with the gate, a bottom surface of the gap fill material is in direct contact with the remaining portion of the conformal dummy gate oxide, and a front surface and a back surface are both in direct contact with the spacers.

14. The method of claim 11, further comprising:
    forming an epitaxially grown region directly on a portion of the fins not covered by the dummy gate lines, the epitaxially grown region is in direct contact with multiple adjacent fins; and
    depositing a dielectric layer on top of the epitaxially grown region.

15. A method comprising:
    depositing a gap fill material directly on top of a conformal dummy gate oxide above and in between fins such that a portion of the conformal dummy gate oxide immediately above the fins remains exposed;

depositing a dummy gate directly on top of the conformal dummy gate oxide and directly on top of the gap fill material;

patterning the dummy gate into dummy gate lines oriented perpendicular to the fins, the dummy gate is patterned selective to the gap fill material and the conformal dummy gate oxide;

forming spacers directly on opposite sidewalls of the dummy gate lines, including sidewalls of the dummy gate and excluding sidewalls of the gap fill material and sidewalls of the conformal dummy gate oxide;

forming a first opening in a source drain region by selectively removing a portion of the conformal dummy gate oxide remaining uncovered by the dummy gate lines, the first opening is between the fins and the gap fill material in the source drain region;

removing the dummy gate from between the spacers exposing the conformal dummy gate oxide and the gap fill material in a gate region;

forming a second opening in the gate region by selectively removing another portion of the conformal dummy gate oxide uncovered by the dummy gate lines, the second opening is between the fins and the gap fill material in the gate region; and forming a gate within the second opening, the gate is in direct contact with both the fins and the gap fill material in the gate region.

16. The method of claim 15, wherein a top surface of the gap fill material is at or below a top surface of the fins.

17. The method of claim 15, wherein the gate is in direct contact with a top surface and two opposite sides of the gap fill material, a bottom surface of the gap fill material is in direct contact with a remaining portion of the conformal dummy gate oxide, and a front surface and a back surface of the conformal dummy gate oxide are both in direct contact with the spacers.

18. The method of claim 15, further comprising:
forming an epitaxially grown region directly on a portion of the fins in the source drain region, the epitaxially grown region extends outwardly from the fins until physically contacting the gap fill material in the source drain region; and
depositing a dielectric layer on top of the epitaxially grown region.

19. The method of claim 15, wherein another portion of the conformal dummy gate oxide remains directly beneath the gap fill material in both the source drain region and in the gate region.

* * * * *